(12) United States Patent
Goto et al.

(10) Patent No.: US 7,738,269 B2
(45) Date of Patent: Jun. 15, 2010

(54) SWITCHING DEVICE AND RELATED OPERATING METHOD

(75) Inventors: Shinya Goto, Gifu (JP); Koji Kawasaki, Anjo (JP); Keiji Shigeoka, Okazaki (JP)

(73) Assignees: Denso Corporation, Tokyo (JP); Nippon Soken, Inc., Nishio (JP)

( * ) Notice: Subject to any disclaimer, the term of this patent is extended or adjusted under 35 U.S.C. 154(b) by 1076 days.

(21) Appl. No.: 11/395,341

(22) Filed: Apr. 3, 2006

(65) Prior Publication Data

US 2006/0220469 A1 Oct. 5, 2006

(30) Foreign Application Priority Data

Apr. 1, 2005 (JP) ............... 2005-105843

(51) Int. Cl.
*H02M 1/12* (2006.01)
*H02M 3/335* (2006.01)

(52) U.S. Cl. ............ 363/41; 323/283; 455/298

(58) Field of Classification Search ............ 363/21.01, 363/21.04, 21.1, 21.12, 21.18, 39, 40, 41, 363/97, 98, 131, 132; 455/297, 298; 323/283
See application file for complete search history.

(56) References Cited

U.S. PATENT DOCUMENTS

| | | | |
|---|---|---|---|
| 5,488,627 A | 1/1996 | Hardin et al. | |
| 6,538,484 B1 | 3/2003 | Rappaport et al. | |
| 6,549,429 B2 | 4/2003 | Konno | |
| 6,992,469 B1 * | 1/2006 | King | 323/283 |
| 7,109,695 B2 * | 9/2006 | King | 323/283 |
| 7,248,027 B2 * | 7/2007 | Ribeiro et al. | 323/282 |
| 7,269,035 B2 * | 9/2007 | Kawasaki et al. | 363/41 |
| 7,482,794 B2 * | 1/2009 | Hunt et al. | 323/284 |
| 2003/0026116 A1 | 2/2003 | Ueki et al. | |
| 2005/0146366 A1 * | 7/2005 | Steinschaden | 327/175 |
| 2006/0140286 A1 | 6/2006 | Goto et al. | |

FOREIGN PATENT DOCUMENTS

| | | |
|---|---|---|
| DE | 10 2005 062 451 A1 | 7/2006 |
| JP | A-60-035399 | 2/1985 |
| JP | A-63-099769 | 5/1988 |
| JP | A-04-058756 | 2/1992 |
| JP | A 2001-218461 | 8/2001 |
| JP | A 2002-335672 | 11/2002 |

(Continued)

OTHER PUBLICATIONS

U.S. Appl. No. 11/319,062, filed Dec. 28, 2005, Goto et al.

(Continued)

*Primary Examiner*—Gary L Laxton
(74) *Attorney, Agent, or Firm*—Oliff & Berridge, PLC

(57) ABSTRACT

A switching device 30 and a related operating method are disclosed for generate a train of drive pulses under a basic pattern for a repetition cycle time T. The train of drive pulses has leading edges shifted from basic time periods T1 by shift amounts $\Phi 0$ to $\Phi 02$, respectively, which are different from each other, whereby switching frequencies, occurring based on the leading edges of the drive pulses, are spread. A spread frequency, which is a inverse number of the cycle time T of the basic pattern, is set to be higher than an audible frequency.

19 Claims, 16 Drawing Sheets

FOREIGN PATENT DOCUMENTS

| | | |
|---|---|---|
| JP | A 2003-079134 | 3/2003 |
| JP | A 2003-079135 | 3/2003 |
| JP | A 2003-088101 | 3/2003 |
| JP | A-2003-153526 | 5/2003 |

OTHER PUBLICATIONS

Translation of German Office Action issued Nov. 28, 2007.

State Intellectual Property Office, P.R. China, 2$^{nd}$ Office Action, Nov. 28, 2008.

German Patent and Trademark Office, Office Action, Dec. 5, 2008.

Notification of Reasons for Rejection issued in Japanese Application No. 2005-105843 on May 7, 2008.

* cited by examiner

FIG. 8

|    | F01     | F12     | F20     |
|----|---------|---------|---------|
| 1  | 96993   | 100100  | 103093  |
| 2  | 193986  | 200200  | 206186  |
| 3  | 290980  | 300300  | 309278  |
| 4  | 387973  | 400400  | 412371  |
| 5  | 484966  | 500501  | 515464  |
| 6  | 581959  | 600601  | 618557  |
| 7  | 678952  | 700701  | 721649  |
| 8  | 775946  | 800801  | 824742  |
| 9  | 872939  | 900901  | 927835  |
| 10 | 969932  | 1001001 | 1030928 |
| 11 | 1066925 | 1101101 | 1134021 |
| 12 | 1163919 | 1201201 | 1237113 |
| 13 | 1260912 | 1301301 | 1340206 |
| 14 | 1357905 | 1401401 | 1443299 |
| 15 | 1454898 | 1501502 | 1546392 |
| 16 | 1551891 | 1601602 | 1649485 |
| 17 | 1648885 | 1701702 | 1752577 |
| 18 | 1745878 | 1801802 | 1855670 |
| 19 | 1842871 | 1901902 | 1958763 |
| 20 | 1939864 | 2002002 | 2061856 |

FIG. 9

| | F01 | F12 | F20 |
|---|---|---|---|
| 1 | 83333 | 90909 | 142857 |
| 2 | 166667 | 181818 | 285714 |
| 3 | 250000 | 272727 | 428571 |
| 4 | 333333 | 363636 | 571429 |
| 5 | 416667 | 454545 | 714286 |
| 6 | 500000 | 545455 | 857143 |
| 7 | 583333 | 636364 | (1000000) |
| 8 | 666667 | 727273 | 1142857 |
| 9 | 750000 | 818182 | 1285714 |
| 10 | 833333 | 909091 | 1428571 |
| 11 | 916667 | (1000000) | 1571429 |
| 12 | (1000000) | 1090909 | 1714286 |
| 13 | 1083333 | 1181818 | 1857143 |
| 14 | 1166667 | 1272727 | 2000000 |
| 15 | 1250000 | 1363636 | 2142857 |
| 16 | 1333333 | 1454545 | 2285714 |
| 17 | 1416667 | 1545455 | 2428571 |
| 18 | 1500000 | 1636364 | 2571429 |
| 19 | 1583333 | 1727273 | 2714286 |
| 20 | 1666667 | 1818182 | 2857143 |
| 21 | 1750000 | 1909091 | 3000000 |

FIG. 12

| Duty \ SHIFT AMOUNT | Φoff0 | Φoff1 | Φoff2 |
|---|---|---|---|
| 1% | • | • | • |
| 2% | • | • | • |
| • | • | • | • |
| • | • | • | • |
| • | • | • | • |
| • | • | • | • |
| • | • | • | • |
| 98% | • | • | • |
| 99% | • | • | • |

| REF. FREQ. \ HARMONICS | ×2 | ×3 | ×4 | ×5 | ×6 | |
|---|---|---|---|---|---|---|
| 50kHz | 100 | 150 | 200 | 250 | 300 | DIFFUSION FREQ. ≒13kHz |
| 47kHz | 94 | 141 | 188 | 235 | 282 | |
| 60kHz | 120 | 180 | 240 | 300 | 360 | |
| 53kHz | 106 | 159 | 164 | 217 | 270 | |

SWITCHING DEVICE AND RELATED OPERATING METHOD

CROSS REFERENCE TO RELATED APPLICATIONS

This application is related to Japanese Patent Application No. 2005-105843 filed on Apr. 1, 2005, the content of which is hereby incorporated by reference.

BACKGROUND OF TB INVENTION

1. Field of the Invention

The present invention relates to switching devices and related operating methods for turning switching power elements on and off and, more particularly, to a switching device and related operating method for performing switching control so as to suppress switching noises occurring during operations of a switching power element.

2. Description of the Related Art

Switching device of this type includes a switching device that is used in an onboard power electronics device installed on, for instance, a vehicle. With the vehicle installed with such an onboard power electronics device, noises occur during operations of the switching device and overlap a frequency of a broadcast station received by an on-vehicle radio receiver. With the frequency of the selected broadcast station overlapped with noises, a speaker of a car audio unit outputs an audible frequency (sound) to which noises are mixed making the user feel uncomfortable.

Technologies have been well known in the art wherein in order to suppress such noises, a spectrum spread scheme is employed to diffuse energies of harmonic components of a switching frequency with a view to eliminating an energy level of average noise. However, although such a technology makes it possible to reduce energies of noises caused by the respective switching frequency and associated harmonic components, difficulties are encountered in the related art in which when the switching frequency and associated harmonic components are overlapped with the frequency of the broadcast station, the speaker outputs noise in an uncomfortable fashion.

Further, although a noise filter is conceivably provided on the switching device at an output side thereof to achieve reduction in noise output from the speaker, the noise filter becomes complex in structure and large in size in order to adequately suppress noise from the speaker.

To address such an issue, attempts have heretofore been made to provide a switching device arranged to set a switching frequency of a switching power element such that harmonics of the switching frequency have a given relationship with a frequency band of a selected broadcast station as disclosed in Japanese Patent Laid-Open Publications No. 2002-335672 and No. 2003-88101. That is, with such a switching device, a train of drive pulses is generated such that the switching frequency is set to a specified frequency different from the selected broadcast station to avoid a speaker from outputting noise.

However, due to piece-piece variations of component parts forming the switching device, the switching frequency is liable to vary with the resultant difficulty in setting the switching frequency with a given relationship maintained with respect to the frequency band of the selected broadcast station. Also, in general practice, an AM broadcast station has one station with a frequency band (bandwidth) in a range of "9 kHz" in Japan and "10 kHz" in USA. Thus, it seems distant for the switching frequency to be set in the given relationship within such narrow frequency bands.

SUMMARY OF THE INVENTION

The present invention has been completed with the above issues in mind and has an object to provide a switching device and related operating method for performing switching control in a mode to appropriately suppress the occurrence of disturbance on communication of audible information caused by noise resulting from switching control.

To achieve the above object one aspect of the present invention provides a switching device for repeatedly tong a switching power element on and off, comprising a memory storing a basic pattern, and a chive pulse generator configured to generate a train of drive pulses under the basic pattern, stored in the memory, for a repetition cycle time having a plurality of basic time periods. The drive pulses have leading edges and trailing edges at least one of which is shifted from beginnings of the basic time periods by different shift amounts, respectively. The basic pattern includes an inverse number of the repetition cycle time laying in a value away from an audible frequency band when switching frequencies and associated harmonics, arising from at least one of the leading edges and the trailing edges of the drive pulses, discontinuously overlap a given frequency for which noise suppression needs to be taken.

With such a structure, at least one of the leading edges and the trailing edges of the drive pulses are shifted from the basic time periods by the different shift amounts. Therefore, the switching frequencies, arising from at least one of the leading edges and the trailing edges of the drive pulses, are spread in a wider range of frequency than that of switching frequencies arising from switching control of the related art wherein the switching frequencies occur at fixed time intervals. This results in remarkable reduction in average level of noises caused by switching control of the switching power element.

However, even when noises we reduced in average level, the switching frequencies and associated harmonics, which are spread, possibly overlap the given frequency. In such a case, noises are mixed to a signal (an audible signal) with audible information appearing at a given frequency. With the structure set forth above, the inverse number of the repetition cycle time, in which the switching frequencies and associated harmonics are liable to overlap the given frequency, is set to a value away from the audible frequency band. Thus, even if the spread switching frequencies and associated harmonics overlap the given frequency, noise output from a speaker on a final stage, arising from the spread switching frequencies and associated harmonics, do not engage the audible frequency band. This enables noises to be appropriately suppressed from disturbing audible information in communication.

The drive pulse generator may repeatedly generate the of drive pulses for the repetition cycle time under the basic pattern in which at least one of the leading edges and the trailing edges of the drive pulses are shifted from the basic time periods by the shift amounts, respectively, which are different from each other. The basic pattern also may include a spread frequency, representing the inverse number of the repetition cycle time for the basic pattern, which is set to be higher tan the audible frequency.

With such a structure, at least one of the leading edges and the trailing edges of the drive pulses are shafted from the basic time periods by the different shift amounts based on the basic pattern. Therefore, the switching frequencies, resulting from at least one of the leading edges and the trailing edges of the drive pulses, are spread in a wider range frequency as that of switching frequencies caused in the related art wherein the switching frequencies occur at fixed time intervals. This results in a remarkable reduction in the average level of noises caused by switching control of the switching power element.

With the structure mentioned above, further, the spread frequency, which is the inverse number of the repetition cycle time for the basic pattern, is set to be higher than the audible frequency. Thus, if the switching frequencies, arising from at least one of the leading edges and the trailing edges of the drive pulses, overlap the given frequency, the inverse number of the repetition cycle time can be reliably kept to be away from the audible frequency band.

The basic pattern may be determined such that all the shift amounts for at least one of the leading edges and the trailing edges of the drive pulses are different from each other.

With the structure described above, the switching frequencies, arising from at least one of the leading edges and the trailing edges of the drive pulses, can be spread in a further aviate fashion.

The memory may store information, including the shi amounts and a sequence of the shift amounts, and offset values. The basic pattern may include the shift amounts for the basic time periods and the offset values added to the shift amounts, respectively, which are arranged for the drive pulses.

With such a structure mentioned above, the basic pattern includes the basic shift amounts and offset values that are appropriately correlated in a predetermined sequence, respectively. This allows the memory to merely store the basic shift amounts and the offset values in the predetermined sequence. Thus, the number of the shift amounts of the basic pattern can be increased with respect to the basic shift amounts.

The basic pattern may include the shift amounts that are determined to have values to preclude harmonics, arising from at least one of the leading edges and the trailing edges of the drive pulses, do not overlap each other in a frequency band for which the noise suppression needs to be taken.

With such a structure, the harmonics of the switching frequencies can be set in a mode not to overlap a given frequency band for which the noise suppression needs to be taken. Therefore, even if a particular harmonic overlap the given frequency, only one particular harmonic appears with the resultant reduction in level of noise to be overlapped with the given frequency. Additionally, with the basic pattern being set in such a mode, all the harmonics arising from the switching frequencies can be avoided from overlapping the given frequency. Thus, even if the harmonics of the switching frequencies overlap the given frequency, the overlapping status can be reliably stopped.

Also, the frequency band may be equal to the given frequency or a frequency band including the given frequency.

The drive pulse generator may perform variable duty control, under a condition where the switching frequencies, arising from the leading edges, and switching frequencies, arising from the trailing edges, do not overlap each other, in a mode to vary the trailing edges with respect to the basic time periods depending on a demanded duty.

With the structure set forth above, if the trailing edges of the train of drive pulses are variably controlled with respect to the basic time periods depending on a demanded duty, switching frequencies, resulting from the trailing edges of the drive pulses, possibly overlap each other ad these switching frequencies possibly overlap the switching frequencies arising from the leading edges determined based on the basic pattern. If such an overlapping status occurs, an energy level of noises increases at an overlapping frequency and a frequency of an integral multiple of such overlapping frequency. With the structure mentioned above, the trailing edges of the drive pulses are variably controlled with respect to the basic time periods under a condition where the switching frequencies, arising from the leading edges of the drive pulses and the switching frequencies, arising from the trailing edges of the drive pulses, do not overlap each other. This avoids an increase in an energy level of noises arising from overlapped statuses between the leading edges and the tailing edges occurring at fixed time intervals.

The drive pulse generator may perform the variable duty control under a condition where the train of drive pulses has an average duty in conformity with a demanded duty.

In a case where a duty cycle of each basic time period is variably controlled, the switching frequency, arising from the leading edge, and the switching frequency, arising from the trailing edge, possibly overlap each other depending on a value of the demanded duty. With the structure mentioned above, some duty cycles of the basic time periods are made different from each other, preventing the train of drive pulses from having a duty to cause the switching frequencies to overlap each other. Moreover, with the train of drive pulses determined to have the average duty in conformity with the demanded duty, the train of drive pulses has a capability of providing the duty in conformity with the demanded duty while appropriately avoiding the switching frequencies from overlapping each other.

The drive pulse generator may perform the variable duty control under a condition where a plurality of harmonics of the switching frequencies, arising from the at least one of the leading edges and the trailing edges of the drive pulses, do not overlap each other in a frequency band for which the noise suppression needs to be taken.

With such a structure set forth above, the variable duty control is performed in the mode to prevent the plurality of harmonics of the switching frequencies from overlapping each other. This avoids an increase in energy level of noises appearing at a frequency in which the harmonics overlap each other.

Further, the frequency band may be equal to the given frequency or a frequency band including such a given frequency.

The given frequency may include a frequency of a frequency band of a radio broadcast and "to overlap the given frequency" refers to a status wherein a frequency difference with respect to the given frequency lies in a bandwidth for one broadcast station of the radio broadcast.

The radio broadcast has broadcast stations each of which has a given frequency band (bandwidth). With the structure mentioned above, the overlapping status is defined using the bandwidth for one broadcast station. Thus, the train of drive pulses can be set in a mode to appropriately address the overlapping status between the frequencies of the is receptive broadcast stations and the switching frequencies followed by the associated harmonics.

The frequency band for which the noise suppression needs to be taken includes a frequency band of a radio broadcast and an expression of "the harmonics overlap each other" refers to a status wherein a frequency difference between the harmonics lies in a bandwidth for one broadcast station of the radio broadcast.

The radio broadcast has the broadcast stations each with the given frequency band (bandwidth). With the structure mentioned above, by the overlapping status is defined sing the bandwidth for one broadcast station, the plurality of harmonics can be appropriately suppressed from overlapping each other in the frequency band of the various broadcast stations.

A difference between an arbitrary one of the shift amounts and another one of the shift amounts is set to a value greater than "Tr×¼" where "Tr" represents a cycle period of a ringing caused by a surge arising from at least one of turn-on and turn-off operations of the switching power element.

During switching control, the switching power element possibly engages the occurrence of surge noises caused by the turn-on and turn-off operations. Under circumstances where audible information is transferred in communication using a frequency band nearly equal to a frequency of ringing resulting from surge noises, the communication of audible information is possibly disturbed by surges followed by ringing. Particularly, surge has a higher energy level than that of ringing, resulting in remarkable disturbance to communication of audible information.

With the structure mentioned above, the difference between the other shift amounts relative to the arbitrary shift amount is set to be higher than the value of "Tr×¼", thereby avoiding surges from occurring at fixed time intervals. This results in capability of causing energy level of surges to be appropriately spread.

Another aspect of the present invention provides a method of operating a switching power element, comprising preparing the switching power element, and applying the switching power element with a train of drive pulses under a basic pattern for a repetition cycle time having a plurality of basic time periods. The drive pulses have leading edges and trailing edges at least one of which are shifted from beginnings of the basic time periods by different shift amounts, respectively, and the basic pattern including an inverse number of the repetition cycle time laying in a value away from an audible frequency band when switching frequencies and associated harmonics, arising from at least one of the leading edges and the trailing edges of the drive pulses, discontinuously overlap a given fluency for which noise suppression needs to be taken.

With such an operating method, at least one of the leading edges and the trailing edges of the drive pulses are shift from the basic time periods by the deferent shift amounts. Therefore, the switching frequencies, arising from at least one of the leading edges and the trailing edges of the drive pulses, are spread in a wider range of frequency than that of switching frequencies arising from switching control of the related art wherein the switching frequencies occur at fixed time intervals. This results in remarkable reduction in the average level of noises caused by switching control of the switching power element.

Also, the inverse number of the repetition cycle time, in which the switching frequencies and associated harmonics are liable to overlap the given frequency, is set to a value away from the audible frequency band. Thus, even if the spread switching frequencies and ated harmonics overlap the given frequency, noise output from a speaker on a final stage, arising from the spread switching frequencies and associated harmonics, do not engage the audible frequency band. This enables noises to be appropriately suppressed from disturbing audible information in communication.

BRIEF DESCRIPTION OF THE DRAWINGS

In the accompanying drawing:

FIG. 8 is a view illustrating examples of the switching frequencies (Hz) and associated harmonics (Hz) caused by the train of drive pulses shown in FIG. 6A.

FIG. 9 is a view illustrating another example of the switching frequencies (Hz) and associated harmonics (Hz) caused by the train of drive pulses shown in FIG. 6A.

FIG. 12 is a view illustrating map data for performing duty control using the train of drive pulses of the second embodiment shown in FIG. 11.

DETAILED DESCRIPTION OF PREFERRED EMBODIMENTS

First Embodiment

Now, a switching device of a first embodiment according to the present invention is described below with reference to the accompanying drawings wherein the switching device is shown as applied to a DC-DC converter installed on a hybrid vehicle.

Figure 1:
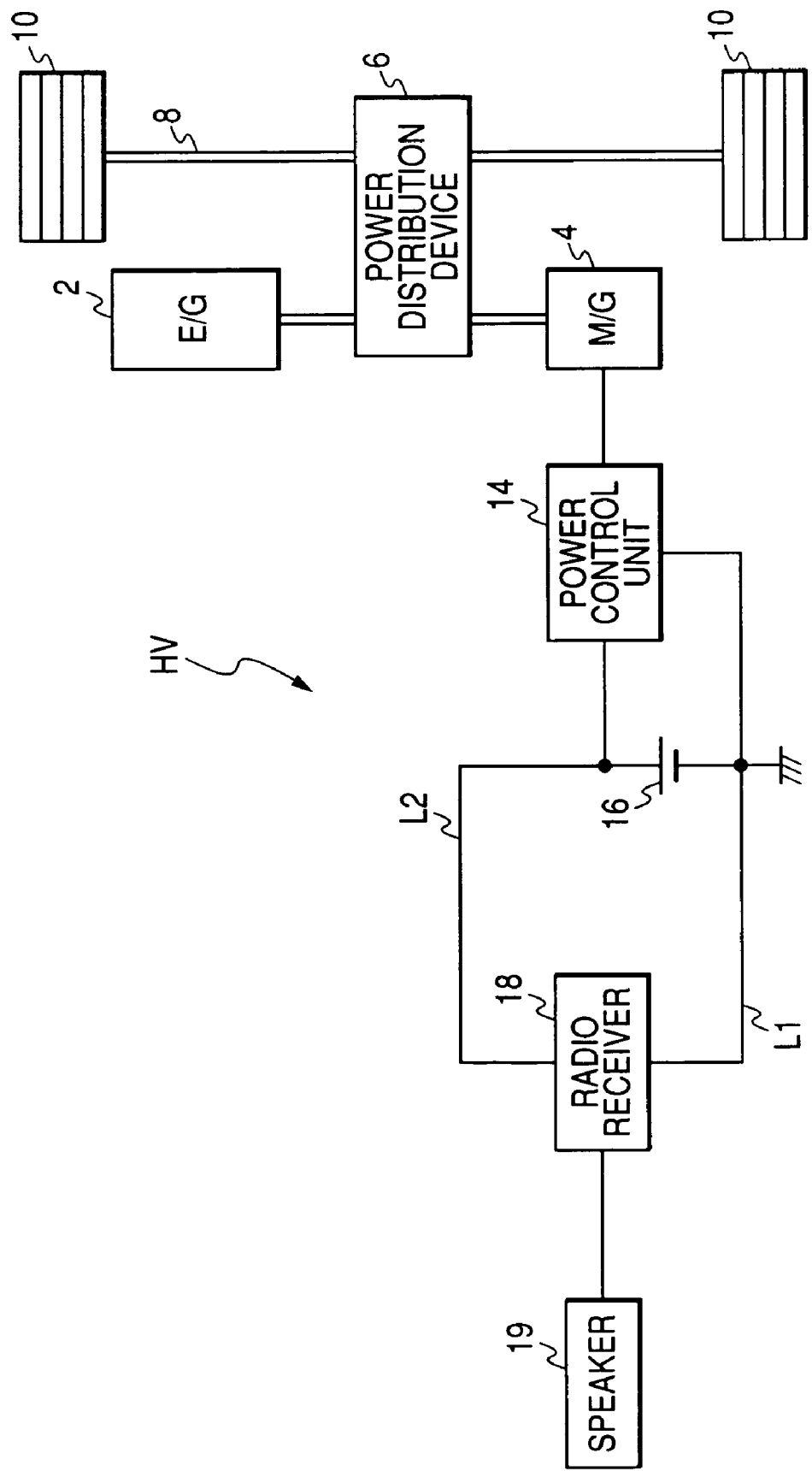
FIG. 1 is an overall structural view of a hybrid vehicle installed with a power control unit incorporating a switching device of a first embodiment according to the present invention.

FIG. 1 shows an overall structure of the hybrid vehicle HV to which the switching device of the first embodiment is applied. The hybrid vehicle HV is shown as including an internal combustion engine 2, a motor generator 4 and a power distribution device 6 connected between the engine 2 and the motor generator 4 to transfer drive powers, delivered therefrom, to drive wheels 10, 10 in a given power distribution mode.

The motor generator 4 operates in a first mode during a power running phase to generate drive power for transfer through the power distribution device 6 to the drive wheels 10, 10 and a second mode during a deceleration of the vehicle to generate regenerative power in response to a drive force delivered from the power distribution device 6. The motor generator 4 is electrically connected to a power control unit 14 that includes a DC-DC converter, an inverter and a high-voltage battery. The power control unit 14 converts AC power, delivered from the motor generator 4, to DC power to be stored in the battery as high-voltage power. Additionally, the power control unit 14 converts high-voltage power to low-voltage power for storage in a battery 16.

Further, the hybrid vehicle HV is installed with a radio receiver 18 and a speaker 19. The radio receiver 18 includes an AM receiver and an FM receiver. Here, the AM receiver serves to detect and demodulate a modulated wave, whose carrier wave is modulated in an analog AM modulation, for outputting an audio signal to be applied to the speaker 19. This AM broadcast has a frequency band ranging from, for insane, 510 to 1720 kHz. In the meanwhile, the FM receiver serves to detect and demodulate a modulated wave, subjected to frequency modulation, to output an audio signal to be applied to the speaker 19. The FM broadcast has a frequency band ranging from, for instance, 76 to 108 MHz.

Figure 2:
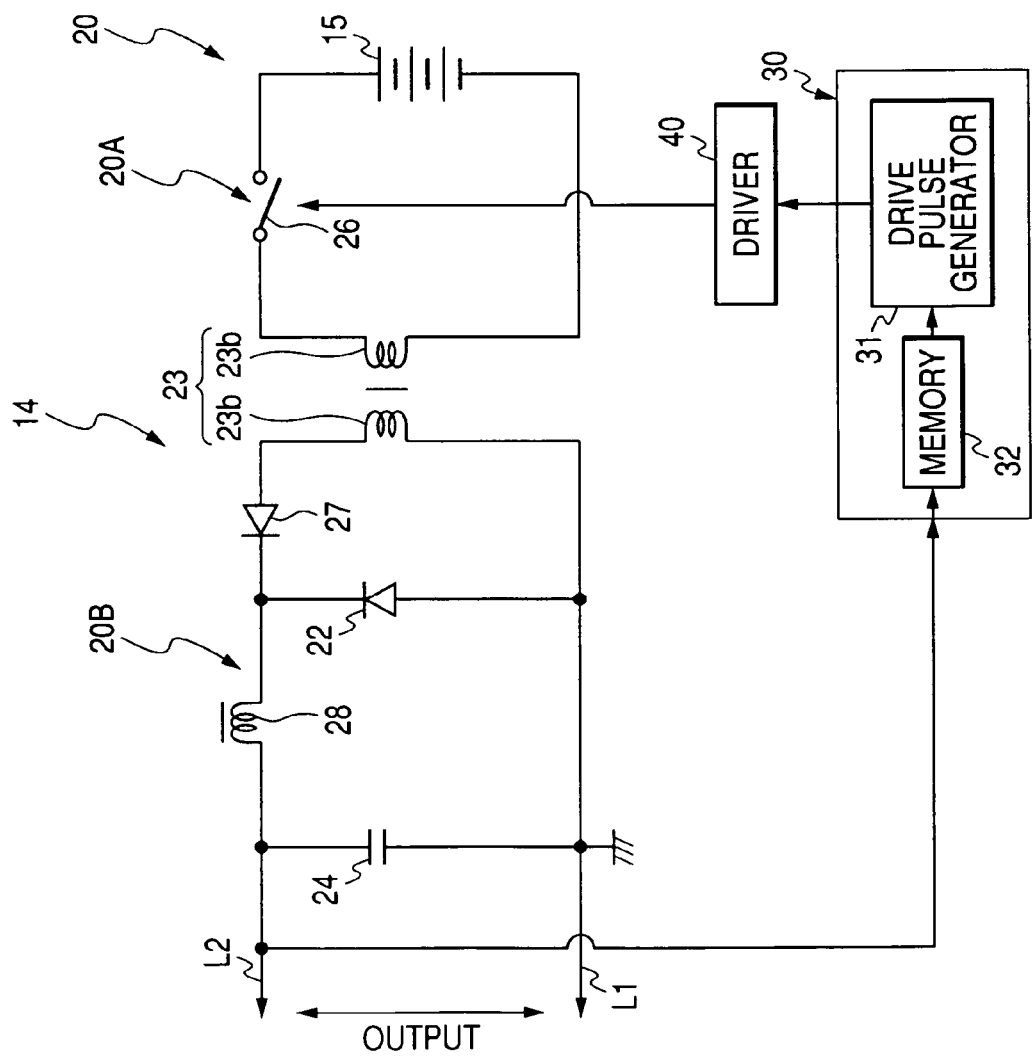
FIG. 2 is a circuit diagram illustrating a structure of a DC-DC converter associated with the switching device shown in FIG. 1.

FIG. 2 shows structures of the DC-DC converter 20 and a switching control device (a switching device) of the power control unit 14.

The DC-DC converter 20 is configured as an insulation type DC-DC converter 20. In particular, the DC-DC converter 20 is comprised of a high-voltage series circuit 20A including a high-voltage battery 15, which stores DC current power delivered from the inverter of the power control circuit 14 using AC power generated by the motor generator 4 shown in FIG. 1, a switching power element 26 in the form of a switching power transistor, and a coil 23a of a transformer 23, and a low-voltage circuit 20B adapted to output low-voltage power to the battery 16 (see FIG. 1). Here, the low-voltage circuit 20B is comprised of a coil 23b of the transformer 23, a first diode 27 and an induction coil 18 which are connected to the coil 23b in series. Also, a second diode 22 is connected between a junction point between the first diode 27 and the induction coil 28 and ground. With such a structure, switching control is performed to repetitively turn the switching power element 26 on and off for controlling the power output of the DC-DC converter 20.

The switching control is performed by a microcomputer 30 playing a role as the switching device. The microcomputer 30 is comprised of a central processing unit 31, serving as a drive pulse generator, and a memory 32 that stores a basic pattern for a train of drive pules to be generated by the drive pulse generator 31 in a mode described later in detail. The microcomputer 30 is applied with a power output from the DC-DC converter 20 and operative to perform switching control to cause a driver 40 to turn the switching power transistor 26 on and off so as to control the power output of the DC-DC converter 20 to a desired level. More particularly, the microcomputer 30 outputs the train of drive pulses through the driver 40 to the switching power transistor 26 that in turn is turned on and off. During switching operations of the switching power transistor 26 under such switching control, noises resulting from switching operations of the switching power transistor 26 are liable to overlap a frequency of a broadcast station received by the receiver 18. Noises are caused to occur during switching operations of the switching power transistor 26 under such switching control and include not only radiation noise but also line noise passing through lines L1, L2 shown in FIG. 1. That is, the line L1, connected to ground of the receiver 18, is connected to the DC-DC converter 20 of the power control unit 14 and the line L2, through which the receiver 18 and the battery 16 are connected, is connected to the DC-DC converter 20 of the power control unit 14, causing noises resulting from the DC-DC converter 20 to be applied to the receiver 18 via the lines L1, L2.

Noises occur when the switching frequencies and associated harmonics generated by the switching power transistor 26 during operations thereof under switching control are mixed to and overlapped with the frequency of the broadcast station received by the receiver 18. Hereunder, a detail of noise will be described with reference to FIGS. 3A to 3C, FIG. 4 and FIG. 5.

Figure 3A:
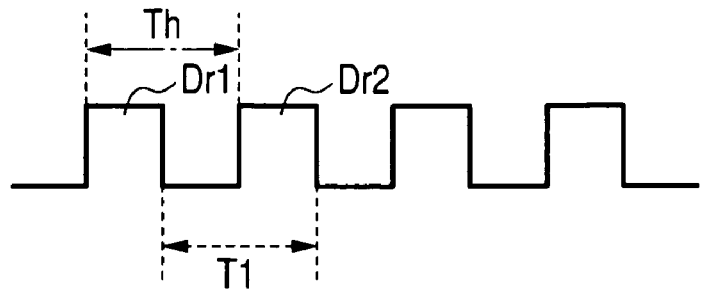
FIG. 3A is a schematic view showing an exemplary waveform of a train of drive pulses by which a switching power transistor of the related art is turned on and off.

FIG. 3A shows a wave of a train of drive pulses Dr1, Dr2 used in the related art practice for driving the switching power transistor 26. In particular, the switching power transistor 26 is turned on during an on-time period (during a period with "H" in logic level) or during an off-time period (during a period with "L" in logic level). For instance, with the switching power transistor 26 being composed of an N-channel MOS transistor, the switching power transistor 26 is turned on during a period wherein the drive pulse remains in "H" logic level. Also, with the switching power transistor 26 including a P-channel MOS transistor, the switching power transistor 26 is turned on during a period wherein the drive pulse remains in "L" logic level. Also, the present invention will be described hereinafter in conjunction with an exemplary case where the switching power transistor 26 is turned on during a period when the drive pulse remains in "H" logic level.

Figure 3B:
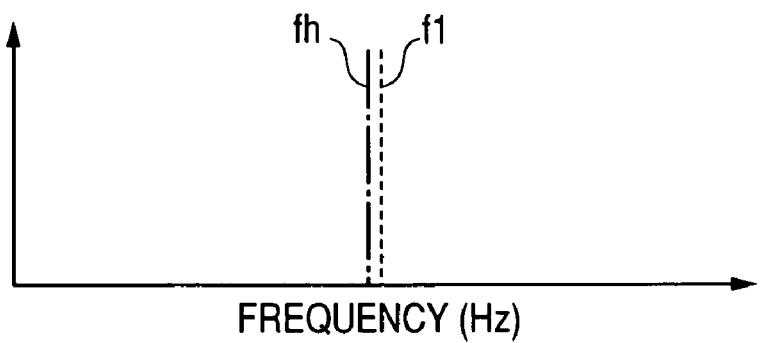
FIG. 3B is a view illustrating how switching frequencies, representing an inverse number of a repetition cycle time of the drive pulses shown in FIG. 3A, occur at the same frequency.
Figure 3C:
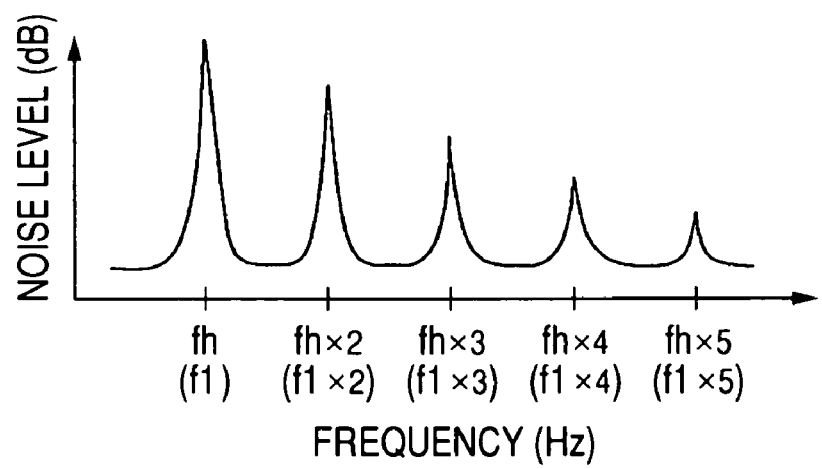
FIG. 3C is a view showing noises in various frequencies caused by overlapped switching frequencies arising from leading edges and avail edges occurring at the fixed time intervals.

With a waveform shown in FIG. 3A, the rain of drive pulses has a 50% duty cycle in which a time interval Th between leading edges (at each of which the switch is turned on) of the adjacent drive pulses Dr1, Dr2 and a time interval T1 between trailing edges (at each of which the switch is turned off) of the adjacent drive pulses Dr1, Dr2 are equal to each other. Therefore, switching frequencies fh, fl, representing inverse numbers of these time intervals Th, T1, occur at the same frequency as shown in FIG. 3B, resulting in an increase in energy level of noise at the switching frequencies fh, fl (with the switching frequencies fh, fl being plotted at slightly deviated points in FIG. 3B for the sake of convenience). Thus, as shown in FIG. 3C, increased energy levels of noises occur at the switching frequencies fh, fl and frequencies of associated harmonics of "fh×2, fh×3, fh×4, fb×5 (fl×2, fl×3, fl×4, fl×5)".

Figure 4:
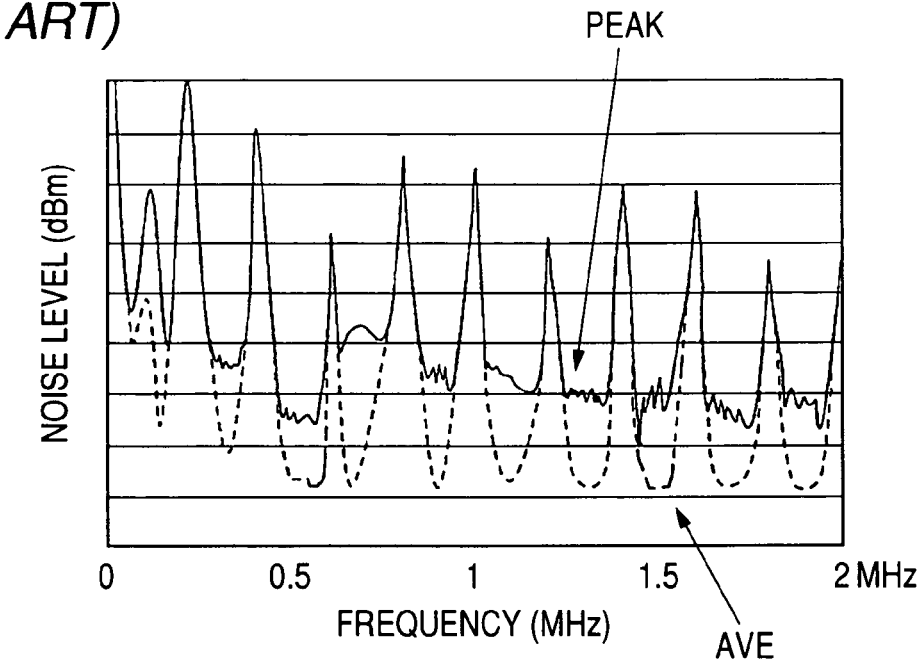
FIG. 4 is a view showing a test result on an energy level of noise resulting from switching control conducted for a switching power transistor using the train of drive pulses shown in FIG. 3A.

FIG. 4 shows an experimental test result on energy levels of noises appearing when the switching power transistor is operated under switching control using the train of drive pulses Dr1, Dr2 shown in FIG. 3A. As shown in FIG. 4, both peak noise, indicated in a solid line, and average noise, indicated in a broken line, demonstate high energy levels, respectively.

Here, the energy levels of noises, resulting from the switching frequencies, may be conceivably reduced under schemes including: (a) PWM control with periods for which respective drive pulses remain in high level being randomized; (b) PWM control with drive pulses having a plurality of frequencies; and (c) switching control with drive pulses having leading edges and trailing edges under a pattern in spread timings such that the leading edges and the trailing edges of the drive pulses do not appear at a fixed time interval.

Figure 5:
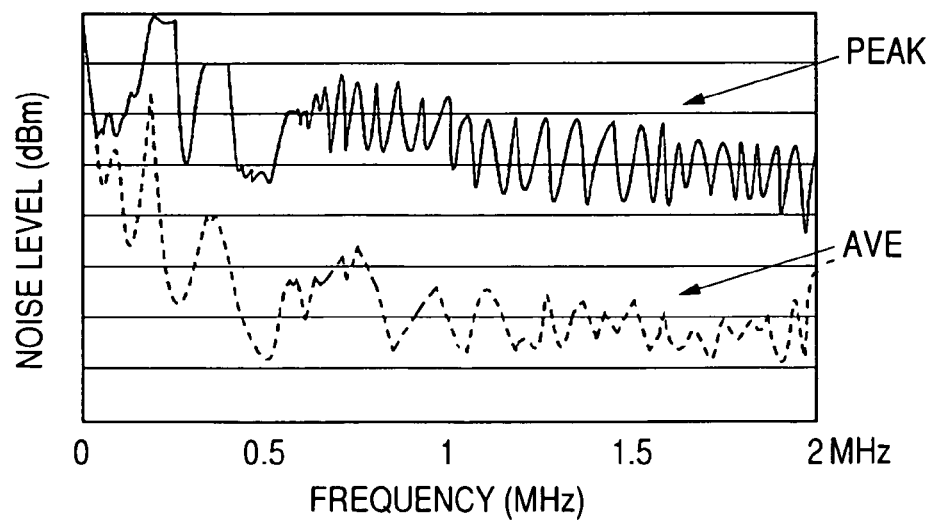
FIG. 5 is a view showing another test result on an energy level of noise resulting from switching control of the other scheme conducted for the switching power transistor.

FIG. 5 shows an experimental result on energy levels of typical noises occurring when the switching power transistor 26 is operated under switching control using such schemes set forth above. As shown in FIG. 5, upon using the scheme mentioned above for performing switching control, remarkable reduction is achieved in energy level of average noise. That is, the experimental test result, shown in FIG. 5, demonstrates that average noise has further reduced energy level than that of FIG. 4.

However, even if energy level of noise is reduced, the switching frequencies and associated harmonics of the switching power element 26 possibly overlap a frequency of a broadcast station received by the receiver 18, causing the speaker 19 to output back noise. Of course, if the train of drive pulses is generated in a way to avoid the switching frequencies and associated harmonics from overlapping the frequency of the selected broadcast station, the issue of back noise can be addressed. However, it is hard for the train of drive pulses to be generated in such a way.

Therefore, with the present embodiment, the memory 32 stores a basic pattern BP1 for a repetition cycle time and the drive pulse generator 31 generates a train of drive pulses under the basic pattern which have leading edges shined from the beginnings of basic time periods by shift amounts, respectively, while keeping a spread frequency, representing an inverse number of the repetition cycle time to be higher ta an audible frequency.

Figure 6A:
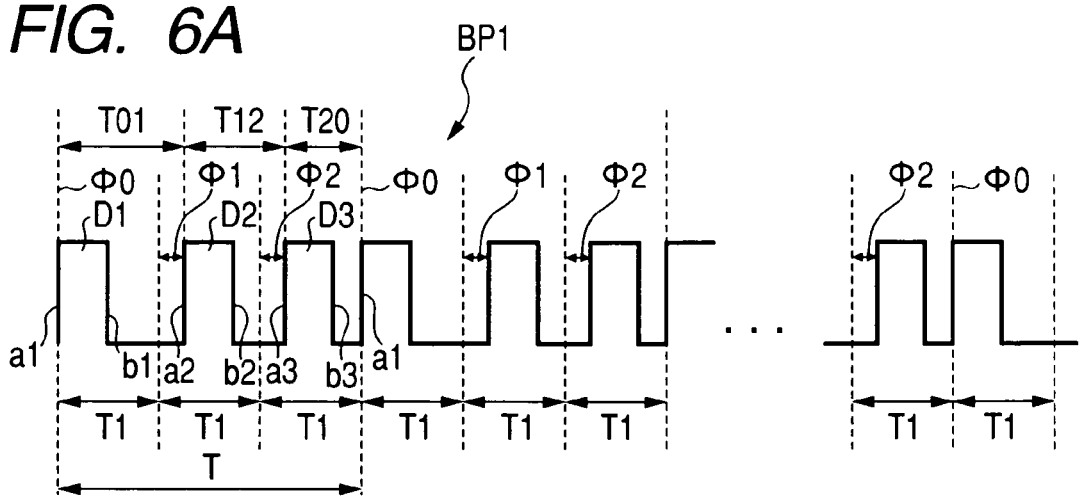
FIG. 6A is a view illustrating one example of a train of drive pulses generated by the switching device of the first embodiment shown in FIG. 2 to be used for performing switching control.
Figure 6B:
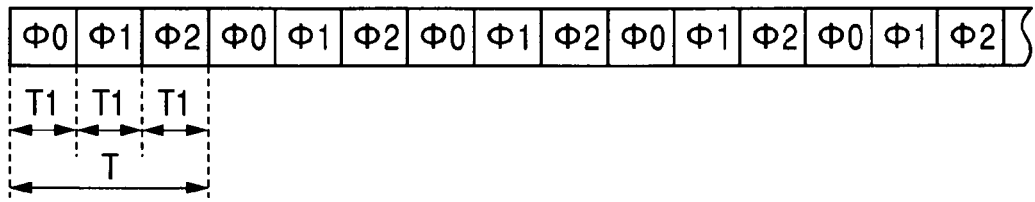
FIG. 6B is a view illustrating a unit of shift amounts for a repetition cycle time of a basic pattern for the train of drive pulses shown in FIG. 6A.
Figure 6C:
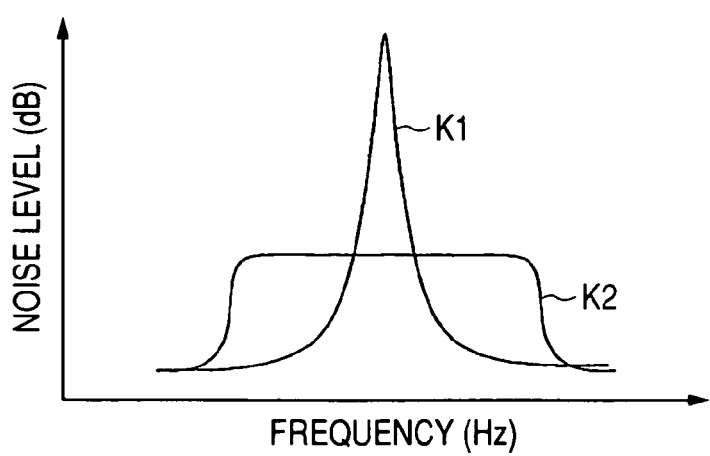
FIG. 6C is a view illustrating energy levels of noise caused by switching control of the related art and noise caused by switching control conducted using the train of drive pulses shown in FIG. 6A.

FIG. 6A shows an example of a waveform of the train of drive pulses D1 to D3 for the repetition cycle time T under the basic pattern stored in the memory 32 (see FIG. 2) for repealed application to the switching power transistor 26. That is, the train of drive pulses D1 to D3 has the repetition cycle time T with three basic time periods T1 associated with the drive pulses D1 to D3, respectively. The drive pulses D1 to D3 have leading edges a1 to a3 shifted from the basic time periods T1 by shift amounts Φ0 to Φ2, lively, which are different from each other with respect to the relevant basic time periods T1, and to edges b1 to b3. Here, the train of drive pulses D1 to D3 are repeated for each repetition cycle time T with the leading edges a1 to a3 of three drive pulses D1 to D3 being shifted from the basic time intervals T1 by respective shift amounts Φ0 to Φ2 that are repeated for each repetition cycle time T in a manner as shown in FIG. 6B. The shift amounts Φ0 to Φ2 are set to be different from each other. Thus, the repetition cycle time T has three time intervals T01, T12 and 770 that have beginnings matching the leading edges a1 to a3 of the three drive pulses D1 to D3. More particularly, the time interval T01 is defined between the leading edges a1, a2 of the adjacent drive pulses D1, D2 shifted by the shift amounts Φ0 and Φ1, respectively. The time interval T12 is defined between the leading edges a2, a3 of the adjacent drive pulses D2, D3 shifted by the shift amounts Φ1 and Φ2, respectively. Likewise, the time interval T20 is defined between the leading edges a3, a1 of the adjacent drive pulses D3, D1 shifted by the shift amounts Φ2 and Φ0, respectively. Thus, when applied with such a train of drive pulses D1 to D3 for the repetition cycle time T, the switching power transistor 26 has switching frequencies F01, F12 and F20, resulting from the shifted leading edges a1 to a3 related to the time intervals T0, T12 and T20, which occur at spread timings and do not overlap each other at the same frequency. Thus, the switching frequencies, caused by the leading edges of the modified time intervals T01, T12, T20, are spread in a wider frequency range than that of the switching frequencies arising from a train of drive pulses occurring at the fixed time intervals shown in FIG. 3A. Therefore, the switching frequencies caused by the train of drive pulses D1 to D3 provide noise with a low energy level as shown by a curve K2 in FIG. 6C. In contrasts when applied with the train of drive pulses with the leading edges appearing at the fixed time intervals as shown in FIG. 3A, the switching frequencies overlap each other at the same frequency and provide noise with a remarkably high energy level as shown by a curve K1 in FIG. 6C.

However, even with the train of drive pulses defined under such a basic pattern shown in FIG. 6A, some of the switching frequencies or associated harmonics possibly overlaps a frequency of an AM broadcast station received by the receiver 18, causing the speaker 19 to output uncomfortable noise. With the present embodiment, the drive pulse generator 31 is configured to generate the train of drive pulses D1 to D3 for the repetition cycle time T such that a spread frequency, representing the inverse number of the repetition cycle time T of the basic pattern, is higher than an audible frequency. With such a waveform of the drive pulses, even if some of the switching frequencies or the associated harmonics is caused to intermittently overlap the frequency of the AM broadcast station received by the receiver 18, the inverse number of the repetition cycle time T becomes higher than the audible frequency. Accordingly, the speaker 19 outputs noise in a range that does not cover the audible frequency, enabling audio noise to be appropriately suppressed from overlapping an audio signal of the broadcast station output from the speaker 19.

Incidentally, as used herein, the term "to be higher than the audible frequency" refers to a status wherein the spread frequency is sufficed to be higher than, for instance, "20 kHz". This comes from the fact that the audible frequency is said to remain in a range from 20 kHz to 20 kHz. Of course, it will be appreciated that such a value is not absolute. In actual practice, there are differences in hearing of humans between individuals and it is rare for an acoustic wave in a range of, for instance, "20 kHz" to be caught by the humans. Therefore, setting the spread frequency to a value higher than a value of, for instance, "15 kHz" results in a remarkable effect.

Now, further detailed description is made of a mode in which the switching frequencies are spread.

Under situations where the switching frequencies lies in an AM radio broadcast band, the switching frequencies are spread such that a frequency difference between the switching frequencies to be spread lies in a value higher than a frequency band (bandwidth) of one station for an AM radio broadcast station. That is, since the bandwidth to be allocated to one station is preliminarily determined in normal practice in such a way where the bandwidth for one station of the AM radio broadcast is allocated to "9 kHz" in Japan, the switching frequencies are spread in a difference greater than such a bandwidth.

Further, under circumstances where the switching frequencies have low-order harmonics involved in the AM broadcast band, the switching frequencies are spread such that a frequency difference among the harmonics involved in the AM broadcast band is selected to be higher than the bandwidth for one station of the AM radio broadcast station.

With such arrangement, even if the frequency of the broadcast station received by the receiver 18 matches the switching frequencies or associated harmonics, a whole of the switching frequencies or associated harmonics can be avoided from matching a frequency of a particular broadcast station. Therefore, even under circumstances where the frequency of the broadcast station overlaps the switching frequencies or harmonics thereof, such an overlapping status can be made discontinuous.

Thus, the switching frequencies and harmonics thereof overlap the frequency of the broadcast station in a discontinuous manner. Further, sing the basic pattern allows the inverse number of the repetition cycle time to be greater than an anile frequency. Thus, noise output from the speaker 19 can be deviated to a value beyond the audible frequency range.

Figure 7:
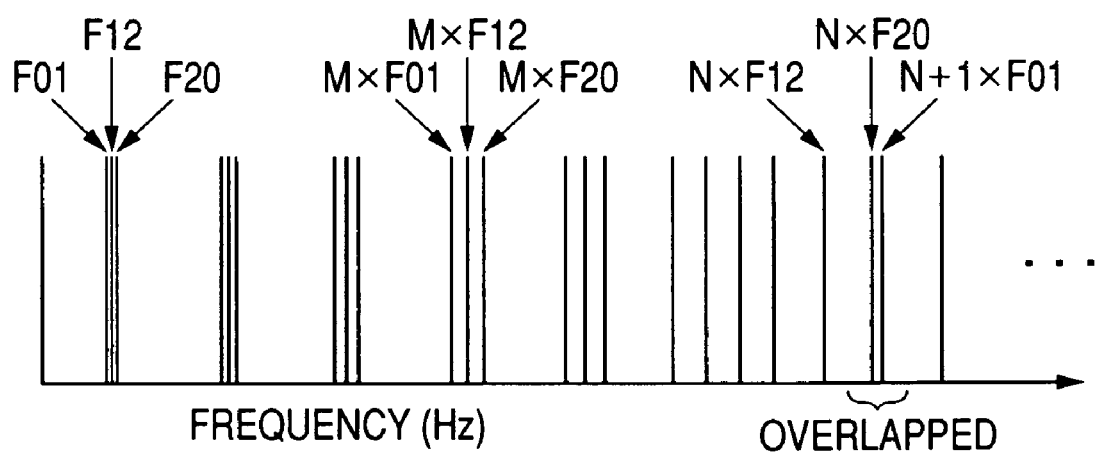
FIG. 7 is a view illustrating an example in which harmonics of the switching frequencies overlap each other at various frequencies.

However, even if the inverse number of the petition cycle time is made higher than the audible frequency under circumstances where the switching frequencies or harmonics thereof overlap the frequency of the broadcast station, the switching frequencies are probable to overlap each other with the resultant inconvenience with an increase in energy level of radiation noise during switching control of the switching power transistor. Moreover, even if the train of drive pulses D1 to D3 has the waveform determined under the basic pattern shown in FIGS. 6A and 6B in a way to cause the switching frequencies F01 to F20, resulting from the time intervals T01 to T20, to be spread, the switching frequencies occurs with harmonics per se possibly overlapping each other as shown in FIG. 7. Incidentally, in FIG. 7, an N-order harmonic of the switching frequency F20 and a (N+1)-order harmonic of the switching frequency F01 overlap each other.

Hereunder, detailed description is made of a method of minimizing energy levels of noises resulting from the switching frequencies and associated harmonics resulting from the leading edges of the drive pulses.

In order to minimize average energy levels of radiation noises caused by the switching frequencies accompanied by the associated harmonics resulting form the time intervals associated with the leading edges of the drive pulses, the switching frequencies and the associated harmonics may be suffice not to overlap each other with a minimal probability in a frequency band for which a measure needs to be taken for noise suppression. In the meantime, with the present embodiment, it is contemplated that the repetition cycle time T of the basic pattern, shown in FIGS. 6A and 6B, and the respective shift amounts Φ0 to Φ2 by which the train of drive pulses is shifted are determined so as to allow the switching frequencies lie in a value imaging from "20 kHz to 1000 Hz". Therefore, is results in consequence for the switching frequencies or relatively low order harmonics thereof to overlap the AM broadcast band and, hence, the present embodiment needs to take a measure for suppressing noises appearing particularly in the AM broadcast band.

With the train if drive pulses D1 to D3 under the basic patter shown in FIGS. 6A and 6B, the switching frequencies FOP, F12, F20 occur on the time intervals T01, T12, T20 in a manner expressed below.

$$F01 = 1/\{T1-\Phi0+101\ 1\}$$

$$F12 = 1/\{T1-\Phi1+\Phi2\}$$

$$F20 = 1/\{T1-\Phi2+\Phi0\}$$

Here, conditions under which the switching frequencies do not overlap each other in the AM broadcast band may be sufficed to satisfy factors described below when the switching frequencies lie in the AM broadcast band.

$$|F01-F21| \geq \text{Bandwidth} \tag{c1}$$

$$|F12-F20| \geq \text{Bandwidth} \tag{c2}$$

$$|F20-F01| \geq \text{Bandwidth} \tag{c3}$$

In the meanwhile, conditions under which the harmonics of the switching frequencies do not overlap each other in the AM broadcast band are described below. First, it is supposed that among the reeve harmonics of the switching frequencies F01, F12, F20, the numbers of orders of harmonics falling in the AM broadcast band are designated as "L", "M", "N". Here, "L", "M", "N" represent integer numbers each greater than "2" and these values are not limited to one value. Thus, the above conditions may be sufficed to satisfy the relationships described below.

$$|L \times F01 - M \times F12| \geq \text{Bandwidth} \tag{d4}$$

$$|M \times F12 - N \times F20| \geq \text{Bandwidth} \tag{c5}$$

$$|N \times t20 - L \times F01| \geq \text{Bandwidth} \tag{c6}$$

Incidentally, the conditions for the switching frequencies mentioned above can be involved under the conditions (c4) to (c6) upon selecting "L", "M", "N" to be the natural number. However, multiplying F01, F12, F20 by "L" "M", "N" yield values that fall in the AM broadcast band. Additionally, in a case where the basic pattern includes the shift amounts Φ0, Φ1, Φ2, . . . Φn, the above-described conditions can be generalized in a manner as described below.

First, suppose that the switching frequencies, resulting from the time intervals of the drive pulses repeated under the basic pattern set forth above, are expressed by Fij (i–0~n, j=i+1; provided that if j=n+1, then, j=0). Then, suppose that those of the switching frequencies or the associated harmonics possibly overlapping the AM broadcast band are expressed by the relationship Pij×Fij provided that "Pij" is a natal number and multiplied by Fij to yield a multiplied product that falls in the AM broadcast band.

In this formula, the following conditions may be established as described below.

$$|Pij \times Fij - Pi'j' \times Fi'j'| \geq \text{Bandwidth} \tag{c7}$$

However, "i" and "i'" are different from each other and also different from "j" and "j'".

For instance, with the train of drive pulses D1 to D3 under the basic pattern shown in FIGS. 6A and 6B, supposing that Φ0=0 μsec, Φ1=2 μsec, Φ2=3 μsec, T1=10 μsec and T=30 μsec, then, equations are yielded as F01=96.933 kHz, F12=100.1 kHz and F20=103.093 kHz. Further, the switching frequencies and associated harmonics vary as shown in FIG. 8.

As shown in FIG. 8, no overlapping takes place between frequencies in the AM broadcast band. Also, a spread frequency, representing the inverse number of the repetition cycle time T of the basic pattern, lies at a value of "33.31 Khz" that is higher than the audible frequency.

On the contrary, with the train of drive pulses D1 to D3 under the basic pattern shown in FIG. 6A, supposing that Φ0=1 μsec, Φ1=2 μsec, Φ2=3 μsec, T1=μsec and T=30 μsec, then, equations are yielded as F01=83.333 kHz, F12=90.909 kHz and F20=142.857 kHz. Further, the switching frequencies and associated harmonics vary as shown in FIG. 9.

As shown in FIG. 9, three harmonic remain in an overlapping state at a frequency of "1000 kHz". That is, a 12-th order harmonic of the switching frequency F01, an 11-th order harmonic of the switching frequency F12 and a 7-th order harmonic of the switching frequency F20 remain in the overlapping state. This results in an increase in noise level at the frequency of "1000 kHz".

Incidentally, the factors for which frequency noises, caused by switching control of the switching power transistor, intensify each other are not limited to the conditions set forth above. For instance, under situations where the spread frequency, representing the inverse number of the repetition cycle time T of the basic pattern, and the associated harmonics overlap the switching frequencies and associated harmonics in the AM broadcast band, frequency noises intensify each other.

For instance, suppose that the basic pattern has two shift amounts Φ0, Φ1 with Φ0=1 μsec, Φ1=2 μsec, T1=10 μsec and T=30 μsec, the switching frequencies F01, P10 are expressed as F01=90.909 kHz and F10=83.333 kHz and a spread frequency lies at a value of "50 kHz". Therefore, all of an 11th-order harmonic of the switching frequency F01, a 12th-order harmonic of the switching frequency F10 and a 20th-order harmonic of the spread frequency lie in a value of "1000 kHz".

Therefore, the basic pattern may be preferably determined under a condition where the spread frequency and associated harmonics and the switching frequencies and associated harmonics age precluded from overlapping each other.

The present embodiment set forth above has advantageous effects listed below.

(1) The train of drive pulses D1 to D3 are generated under the basic pattern for the repetition cycle time T with the leading edges of the drive pulses being shifted from the respective basic time periods T1 by the plural shift amounts Φ0 to Φ02, respectively, and the spread frequency, representing the inverse number of the repetition cycle time T for the basic pattern, is set to be higher than the audible frequency. This make it possible for the switching frequencies, each generated in the time interval between the relevant leading edges of the drive pulses, to be set to values different from each other. Thus, the switching frequencies can be spread in wide frequency areas as compared to those of the switching power transistor driven with a train of drive pulses appearing at fixed time intervals practiced in the state-of-the art switching control. Accordingly, average energy levels of noises caused by switching control of the present embodiment can be remarkably reduced. Moreover, with the spread frequency being set to be higher than the audible frequency, even if the switching frequencies overlap the given frequency for which noise suppression is needed, the inverse number of the repetition cycle time for the basic pattern preclude the switching frequencies and associated harmonics from overlapping each other in the audible frequency band. Thus, no noise is mixed to an audible output from the speaker 19 on a final stage in the audible frequency band, achieving appropriate noise suppression for preventing the disturbance of audible information in communication.

With the train of drive pulses repeated under the basic pattern set forth above, further, the switching frequencies can be set to a long wave (LW), in which low order harmonics are caused to overlap an AM broadcast band, and a middle wave (MW) falling in the AM broadcast band. Additionally, providing the train of drive pulses under such a basic pattern to cause the switching frequencies to lie at such a relatively high frequency range enables the minaturization of the DC-DC converter 20.

(2) The basic pattern for the train of drive pulses are determined in a way to cause the leading edges of the drive pulses to be shifted from the basic time periods by the respective shift amounts such that the harmonics of the switching frequencies, resulting from the time intervals associated with the leading edges of the drive pulses, do not overlap each other in the frequency band for which the switching device needs to take a measure for suppressing noises. Therefore, even if a particular harmonic overlaps a frequency of a broadcast station selected in the AM broadcast band, the particular harmonic includes only one harmonic, causing reduction in energy level of noise to be overlapped with the frequency of the broadcast station. In addition, with the basic pattern being determined in such a way to cause the switching frequencies to occur in such a noise suppression mode, all of the harmonics caused by the switching frequencies can be avoided from overlapping the frequency of the broadcast station. Thus, even if the harmonics of the swishing frequencies are caused to overlap the frequency of the broadcast station, such an overlapping state is made discontinuous in a reliable fashion.

Second Embodiment

Next, a second embodiment is described below with reference to the accompanying drawings with a focus on points differing from the first embodiment.

With the first embodiment, the switching frequencies and associated harmonics, appearing at beginnings of the time intervals each between the leading edges of the drive pulse, are spread under the basic pattern of the train of drive pulses. However, even with such a train of drive pulses under the basic pattern with the switching frequencies and associated harmonics being spread in such a way, the switching frequencies and associated harmonics, appearing at endings of the time intervals each between the trailing edges of the relevant drive pulses possibly overlap each other. Or, these frequency components possibly overlap the switching frequencies and associated harmonics, appearing at the beginnings of the time intervals each between associated leading edges of the relevant drive pulses. Thus, under such circumstances, energy levels of noises increase at a particular frequency.

Figure 10:
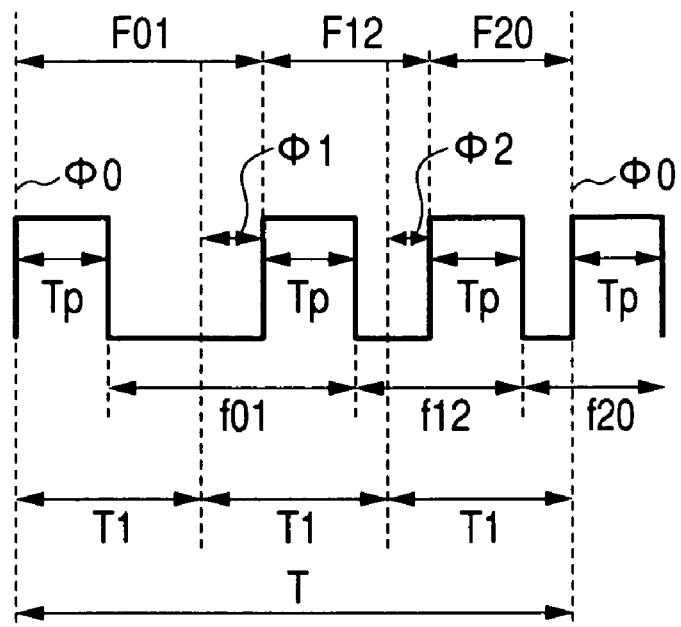
FIG. 10 is a waveform diagram of a train of drive pulses for illustrating issues of duty control.

That is, with the train of drive pulses D1 to D3 having the same pulse widths in the example shown in FIGS. 6A and 6B, a switching frequency F01, shown in FIG. 10, and a switching frequency f01 are equal to each other. Further, a switching frequency F12 and a switching frequency f12 are equal to each other. Furthermore, a switching frequency F20 and a switching frequency f20 are equal to each other.

With the present embodiment, the memory 32 of the switching device (microcomputer) 30, shown in FIG. 2, stores a basic pattern BP2 for a repetition cycle time TA, and the drive pulse generator 31 that is configure to generate a train of drive pulses D5 to D7 under the basic pattern TA which have leading edges as to a7 shifted from the beginnings of basic time periods T1a by shift amounts Φon0, Φon1, Φon2, respectively, and trailing edges b5 to b7 shifted from the beginnings of the basic time intervals T1a by shift amounts Φoff0, Φoff1, Φoff2, respectively. Thus, switching frequencies and associated harmonics, arising from such leading and trailing edges of the drive pukes, can be kept away from overlapping each other in a frequency band for which a measure needs to be taken for suppressing noises.

In the meanwhile, the DC-DC converter 20 has the output that needs to be controlled to a demanded output. To satisfy such requirement, the switching power transistor 26 is required to operate in varying duty cycles depending on the demanded outputs. To satisfy such requirement, with the present embodiment, the drive pulse generator 31 is configured to generate the to of drive pulses D5 to D7 under the basic pattern BP2 such that the trailing edges b5 to b7 are shifted from the respective basic time periods T11 by the shift amounts Φoff0 to Φoff2 depending on the demanded output. Thus, the drive pulses D5 to D7 have duty cycles, each representing a ratio (or a percentage) of on-time with "H" in logic level to a ratio of off-time with "L" in logic level with respect to each basic time period T1$a$, which are variably controlled. However, under such a situation, depending on a mode in which the duty cycles are variably controlled, the switching frequencies and the associated harmonics, arising from the leading edges or tailing edges of each drive pulse, possibly overlap each other. For instance, if the drive pulses are designed to have the same duty cycle for the respective basic time periods under the basic pattern, switching frequencies and associated harmonics, arising from both the leading edges and the trailing is edges of the drive pulses for a given duty, are probable to overlap each other.

Figure 11:
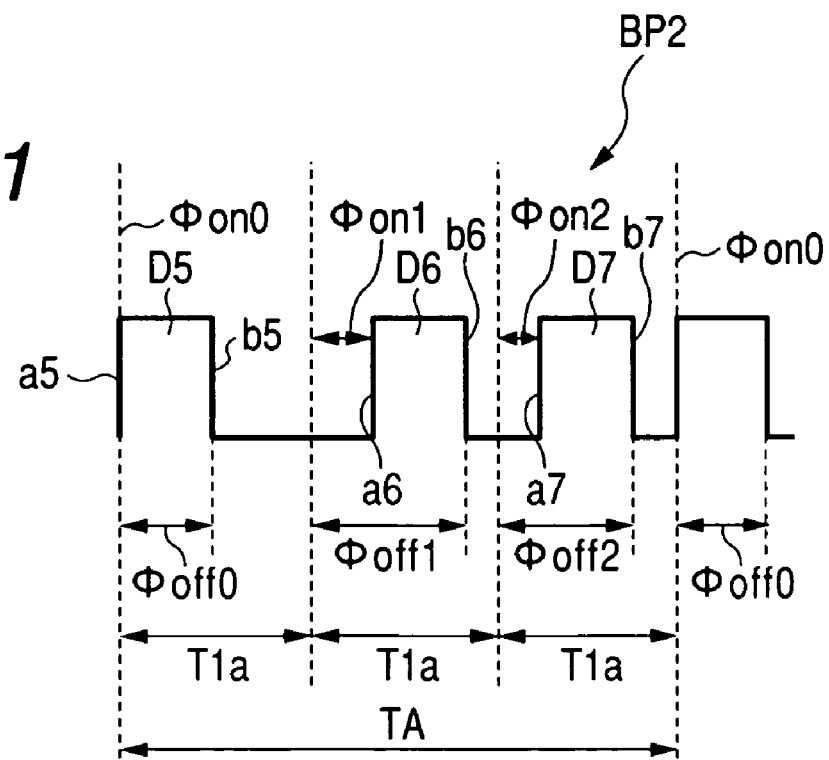
FIG. 11 is a waveform diagram of a train of drive pulses of a second embodiment according to the present invention.

Therefore, with the present embodiment, the drive pulse generator 31 is configured to generate the train of drive pulses D5 to D7 based on the basic pattern BP2, stored in the memory 32, for repetition cycle time TA so as to perform duty control. Duty control is performed to provide an average duty, represented by a ratio of a total time interval on on-time for each drive pulse with "H" in logic level to off-time for each drive pulse with "L" in logic level for the repetition cycle time TA, in conformity with a demanded duty. To perform such duty control, the drive pulses D5 to D7 have duty cycles, some of which are different from each other, for the basic time intervals Ta1 under the basic pattern BP2 wherein the trailing edges b5 to b7 are shifted from the beginnings of the respective basic time periods T1$a$ by the shift amounts Φoff0 to Φoff2 depending on the demanded output. For instance, with the waveform shown in FIG. 11, in order for the drive pulses D5 to D7 to have the average duty for the repetition cycle time TA under the basic pattern BP2 so as to provide the demanded duty, the train of drive pulses preferably have the relationship described below where the demanded duty is represented as "DT".

$$DT=\{\Phi off0-\Phi on0+\Phi off1+\Phi on1+\Phi off2-\Phi on2\}/T$$

In order to perform duty control in such a mode, the memory 32 of the microcomputer 30 is arranged to store a map exemplified in FIG. 12. This map specifies the relationship between the demanded duty and the shift amounts of Φoff0 to Φoff2.

Moreover, when deter mg such shift amounts with a view to having the demanded duty, the memory 32 of the microcomputer 30 stores a map under which the basic pattern BP2 has a waveform for the drive pulses to have the leading edges a5 to a7 and the trailing edges b5 to b7 determined at timings such that the switching frequencies, arising from the leading edges and the trailing edges of the drive pulses, do not overlap each other and the associated harmonics do not overlap each other in a particular frequency band for which the switching device weeds to take a measure to suppress noises.

The present embodiment set forth above has, in addition to the advantageous effects (1) and (2) mentioned above, further advantageous effects listed below.

(3) The basic pattern is determined to provide the train of the drive pulses with waveform to perform variable control on duty to achieve a desired control quantity depending on the demanded duty under conditions where the switching frequencies, arising from the trailing edges of the drive pulses, do not overlap each other. This enables the avoidance of an increase in a noise level due to the occurrence of the overlapping status between the switching frequencies.

(4) The duty cycles of the drive pulses in respective basic time periods are variably controlled in different values under a condition where the average duty for the repetition cycle time is controlled to a demanded control quantity. This enables the train of drive pukes to provide the demanded duty for the repetition cycle time while avoiding the switching frequencies from overlapping each other in a satisfactory fashion.

(5) The duty cycles of the drive pulses in respective basic time periods are variably controlled with the duty for the repetition cycle time under which a plurality of harmonics arising form the switching frequencies do not overlap each other in a frequency band for which the switching device needs to take a measure to suppress noises. This results in capability of avoiding an increase in noise level resulting from frequencies of the overlapped harmonics.

Third Embodiment

Now, a third embodiment is described below with reference to the accompanying drawings with a focus on a difference with respect to the first embodiment.

With the present embodiment, the memory 32 of the microcomputer 30 is arranged to store a basic pattern with information on a plurality of basic shift amounts, different from each other, and a related sequence of these basic shift amounts and relevant offset values upon which the offset values are added to the basic shift amounts to provide respective products din are alternately arranged to define the basic pattern.

Figure 13:
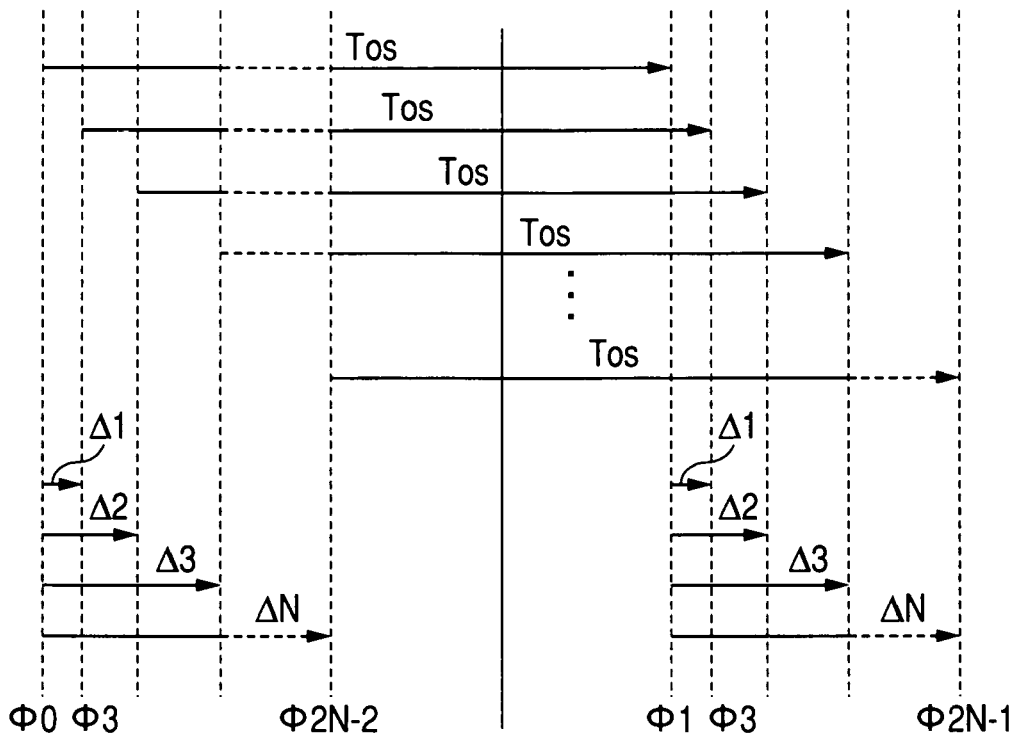
FIG. 13 is a diagram showing a basic pattern to be used for a train of drive pulses of a third embodiment according to the present invention.

More particularly, as shown in FIG. 13, the memory 32 of the microcomputer 30 is arranged to store the basic pattern with the plurality of basic shift amounts Δ1 to ΔN and related sequence of these basic shift patterns and, in addition thereto, the offset values Tos. Therefore, the basic pattern is specified as Φ0−Δ1, Φ1=Δ1+Tos, Φ2=Δ2, Φ3=Δ2+Tos, . . . , Φ(2N−2)=ΔN, Φ(2N−1)=ΔN+Tos.

The present embodiment set forth above has, in addition to the advantageous effects (1) and (2) of the first embodiment, a further advantageous effect as listed below.

(6) The memory 32 of the microcomputer 30 is arranged to store the plurality of basic shift amounts Δ1 to ΔN with the related sequence of these basic shift amounts and the offset values Tos under which the basic pattern is defined. Thus, by permitting the memory 32 of the microcomputer 30 to merely store the offset values Tos in addition to the plurality of basic shift amounts Δ1 to ΔN with the related sequence of these shift amounts, the number of the basic shift amounts for the basic pattern can be doubled as compared to the number of the basic shift amounts Δ1 to ΔN.

Fourth Embodiment

Now, a fourth embodiment is described with reference to the accompanying drawings with a focus on a differing point with respect to the first embodiment.

With the various embodiments set forth above, the train of drive pulses is arranged to have the waveform under which the switching frequencies are set to a relatively high frequency range such as a long waveform (LW) and a frequency band of an AM broadcast for thereby enabling the realization of the switching device in a miniaturized structure. However, a basic pattern takes the form of a waveform such that the higher the switching frequencies will be, the greater will be the gradients of the leading edges and the gradients of the trailing edges of the drive pulses. This causes the turn-on and turnoff operations of the switching power transistor 26 to result in the occurrence of increased surge noise.

Figure 14:
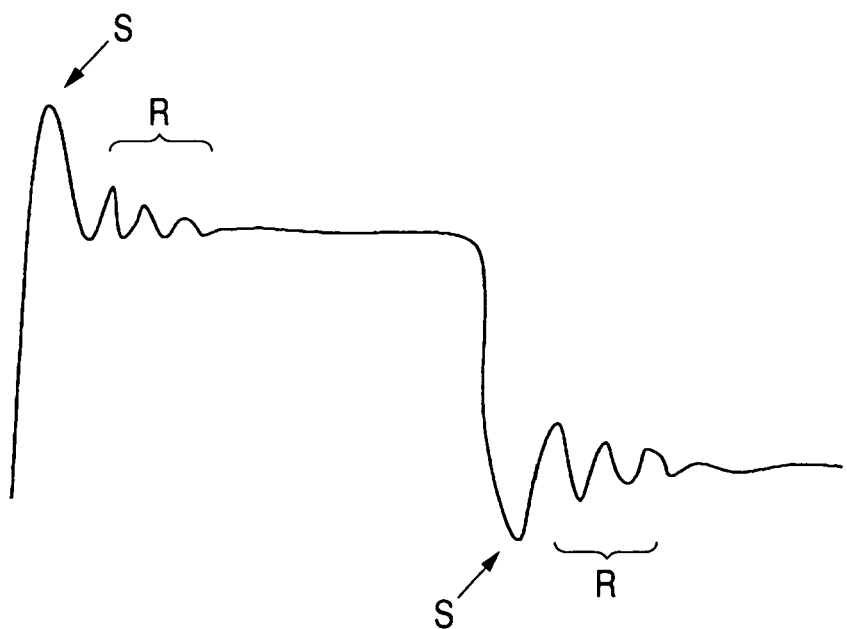
FIG. 14 is a waveform diagram showing surges followed by ringing noses.

As shown in FIG. 14, surges S include peak noises, each occurring in synchronism with the turn-on or turn-off operations of the switching power transistor 26, each of which is followed by ringing R occurring in attenuated vibration. Such a vibrating frequency (ringing frequency) of noise has a resonant frequency that is determined based on structures of peripheral circuits of the switching power transistor 26 such as those including a snubber circuit and a wiring inductance or the like in the area around the switching power transistor 26. Additionally, since the ringing frequency normally varies in a value ranging from several MHz to several hundreds MHz, surge noises S and ringing noises R possibly overlap a frequency band of an FM broadcast.

To address such a consequence, the present embodiment contemplates to allow the memory 32 of the microcomputer 30 to store a train of drive pulses under a basic pattern determined to cause surge noise and ringing noise, liable to overlap the frequency band of the FM broadcast, to be spread in a wide range of frequency.

Figure 15A:
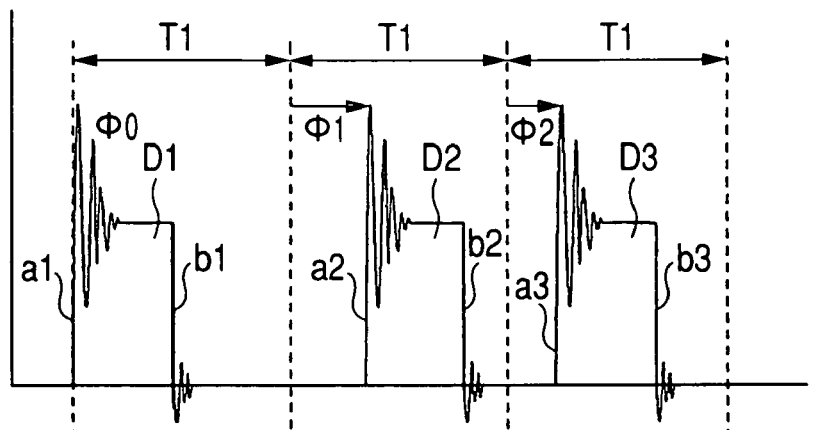
FIG. 15A is a waveform diagram showing a train of drive pulses of a fourth embodiment with surge noises followed by ringing noses, which are spread in frequency.

FIG. 15A shows an example in which surge noises, arising in synchronism with the leading edges a1 to a3 of drive pulses D1 to D3, are spread in frequency under the basic pattern including three shift amounts (shift amounts of Φ0 to Φ2) different from each other.

Figure 15B:
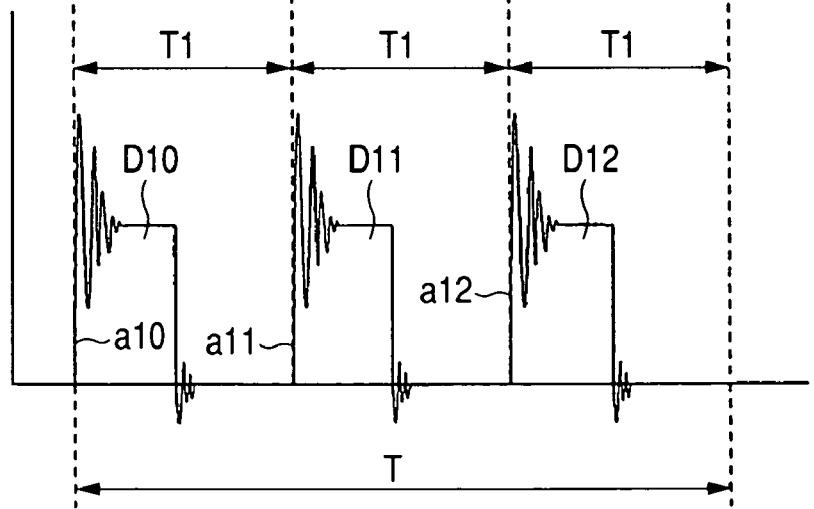
FIG. 15B is a waveform diagram showing a train of drive pulses practiced in the related art with surge noises followed by ringing noses, which occur at fixed time intervals.

On the contrary, FIG. 15B shows an example of surge noises and ringing noises, arising in synchronism with leading edges a10 to a12 of drive pulses D10 to D12 appearing at fixed time intervals T1.

With the waveform of the train of drive pulses D10 to D12 shown in FIG. 15B, surge noises accompanied by ringing noises occur in synchronism with the leading edges a10 to a12 of the drive pulses D10 to D12 for the respective basic time periods T1.

In contrast, with the waveform of the train of drive pulses D1 to D3 shown in FIG. 15A, surge noises accompanied by ringing noises occur at spread timings under the basic pattern BP1.

Here, description is made of a mode in which an optimum basic pattern is set for a train of drive pulses with a view to minimizing an average energy level of surge noises and ringing noises covered in an FM band.

Figures 16, 17:
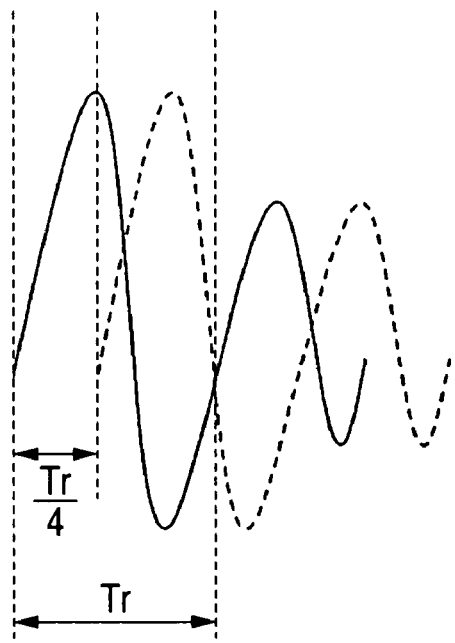
FIG. 16 is a view showing waveform diagrams illustrating how surge noises are spread during switching control performed by the fourth embodiment.
FIG. 17 is a view showing the relationship between basic switching frequencies and harmonics in various orders.

In FIG. 16, surge and ringing, designated in a broken line, occur in phase deviated by a quarter of a ringing period of Tr with respect to surge and ringing indicated in a solid line. In this case, peaks of surge and ringing can be avoided from appearing at given periods. Thus, under circumstances where surge and ringing are deviated by the value of "¼" of the period Tr, surge and ringing can be caused to appear at appropriately spread timings. However, under situations where the leading edges of the train of drive pulses are shifted by values greater than the three shift amounts, a difference among all the shift amounts cannot be set to a value of "¼" of the period Tr.

To avoid such inconvenience, with the present embodiment, differences (|Φ0−Φ1| and |Φ2−Φ0|) between the other it amounts (Φ1, Φ2) with respect to an arbit shift amount (such as for instance, Φ0) is supposed to lie in the relationship "Tr×{(¼−¾)+N}: N=0, 1, 2, ... ". With the shift amounts being set in such a way, among surges accompanied by ringing, surges with noises in the highest energy levels can be avoided from appearing at fixed time intervals or peaks of surges and ringing can be avoided from intensifying each other. In addition, with the present embodiment, the train of drive pulses has the basic pattern under which the leading edges of the drive pulses are shifted by the given shift amounts different from each other. This allows surge noises and ringing noises to occur at further spread timings. Such spread timings for surge noises and ringing noises to occur can be realized by providing a train of drive pulses whose leading edges are shifted by the shift amounts under the relationships "Φ0=0, Φ1=Tr/4+M×Tr, Φ2=¼×Tr+N×Tr".

However, when performing switching control in such a mode to allow surge noises and ringing noises to appear in a long wave band and a frequency band of an AM broadcast, a measure needs to be taken for noise suppression for the AM broadcast. Under such a situation, if the drive pulse generator 31 of the switching device 30 (see FIG. 2) generates a train of drive pulses whose leading edges are shifted from the respective basic time intervals by shift amounts expressed as "Φ0=0, Φ1=Tr/4, Φ2=⅝×Tr", switching frequencies and associated harmonics, arising from the leading edges of the drive pulses generated under the basic pattern shown in FIG. 15A, substantially overlap each other in the frequency band of the AM broadcast. Therefore, in order to take a measure to address the issue of noises in the frequency band of the AM broadcast, the memory 32 of the microcomputer 30 stores a basic pattern in which the leading edges of the drive pulses are shifted from the respective basic time intervals by shi amounts under which switching frequencies, arising from the leading edges of the drive pulses, do not overlap each other in the frequency band of the AM broadcast. Under such a basic pattern, a difference between the relevant shift amounts is set to be less than the basic time period T1. Additionally, a spread frequency, representing the inverse number of the repetition cycle time T, of the basic pattern shown in FIG. 15A, is set to be higher than the audible frequency.

The present embodiment mentioned above has advantageous effects described below.

(7) The difference between an arbitrary shift amount and the other shift amount is determined under the relationship "Tr×{(¼−¾)+N}: N=0, 1, 2, 3, ... " and, thus, noise energies, caused by surge and ringing arising from the leading edges of the drive pulses, can be spread in a wide range.

Other Embodiments

Also, the various embodiments set forth above may be implemented in modifications listed below.

With the fourth embodiment set forth above, the difference between the arbitrary shift amount and the other shift amount are set to satisfy the relationship expressed as "Tr×{(¼−¾)+N}: N−0, 1, 2, 3, ... ". However, in view of the fact that noise has the highest energy level due to the occurrence of surge, the presence of the train of drive pulses whose leading edges are shifted by the respective given shift amounts set forth above with the difference greater than "Tr×¼" results in remarkable reduction in average energy level of noise. Thus, surges can be appropriately avoided from appearing at the basic time periods.

With the various embodiments set forth above, the basic pattern for the train of drive pulses are determined such that the leading edges and the trailing edges of the drive pulses occur at the spread timings to cause the switching frequencies and the associated harmonics and the spread frequency not to overlap each other in the frequency band for which noise suppression is needed, whereby the energy level of noise is minimized. In addition to such arrangement for the basic pattern to be determined, an inverse number of the basic time period T1, shown in FIG. 6A, and the associated harmonics may be arranged not to overlap each other in the frequency band for which noise suppression is needed. This is particularly effective when a method, for generating a train of drive pulses under a basic pattern for a repetition cycle time in which leading edges and trailing edges of the drive pulses are shifted from respective basic time periods, is executed using a reference clock pulse based on a vibrating frequency reflecting the inverse number of the basic time period. Although the train of drive pulses by which the witching power transistor 26 is driven is different from the reference clock pulse, a reference clock pulse generator and the switching power transistor 26 are connected to each other through lead wires which cause the reference clock pulse to play a role as a noise source. Of course, in this case, radiation noise resulting from the clock pulse also becomes a noise source.

While the various embodiments have been described above with reference to the examples wherein the basic pattern is utilized to allow the drive pulses to have the time intervals associated with the leading edges, a basic pattern may be determined such that the train of drive pulses has time intervals associated with trailing edges. Moreover, the drive pulse generator 32 of the switching device 30 may be altered so as to generate a train of drive pulses under a basic pattern in which the switching power transistor 26 is turned on with "L" in logic level of the drive pulse and the switching power transistor 26 is turned off with "H" in logic level of the drive pulse.

With the various embodiments set forth above, the frequency band, for which the switching control device (switching device) needs to take the measure for noise suppression, has been selected to lie in a whole area (such as, for instance, a whole AM frequency band of "510 to 1710 kHz") of the frequency band of the radio broadcast that is is targeted. Upon setting the frequency band to such a whole range, even if a user listens to audio information received by any AM radio broadcast, noise suppression could be achieved in success by taking such switching control for the switching power transistor. However, it will be appreciated that the present invention is not limited to the whole area of the frequency band of the radio broadcast for which noise suppression is needed. For instance, among the frequency band ranging from "510 to 1000 kHz" and the frequency band ranging from "1000 to 1710 kHz" in the AM frequency band, any one of these frequency bands may be selected as a frequency band, for which noise suppression needs to be taken, which includes a broadcast station selected by the user. Depending on whether or not any of these two frequency bands includes the radio station selected by the user, the modes of switching control may be altered. With such alteration, the drive pulse generator 31 of the switching device 30 is arranged to easily generate a train of drive pulses with a basic pattern under which switching frequencies and associated harmonics do not overlap each other in these frequency bands. That is, under situations where switching control is executed with the occurrence of switching frequencies in an LW band at a frequency lower than, for instance, an AM frequency band, the train of drive pulses is hard to be generated under a basic pattern so as to preclude harmonics from overlapping each other in a whole area of the AM frequency band. To address such an issue, switching control is executed in variable modes (under various basic patterns and various duly control patterns) and, hence, various basic patterns can be easily set so as to cause the drive pulse generator 32 of the switching device 30 to generate a of drive pulses with leading edges thereof causing harmonics not to overlap each other. Also, in this case, spread frequencies may be set to be different from each other for each basic pattern.

In another alternative, a basic pattern may be determined and duty control may be performed to execute switching control in modes to prevent switching frequencies and associated harmonics, arising from leading edges of the drive pulses, from overlapping carrier waves of various broadcast stations. Moreover, with a vehicle installed with a location detection device such as a GPS or the like, a frequency of an available broadcast station may be detected using the detected location of the vehicle delivered from the location detection device and switching control may be executed in variable modes in a way to preclude the switching frequencies and associated harmonics from overlapping a frequency of the detected broadcast station. Even with switching control being executed in such variable mode, the switching frequencies and the associated harmonics probably overlap a carrier wave of an available broadcast station due to inherent varying characterstics of the DC-DC converter 20 and the driver 40 accompanied by surrounding temperatures and, hence, a spread frequency may be preferably selected to be higher than an audible frequency with a savory result.

The frequency signal for which the switching device needs to take a measure for noise suppression is not limited to the frequency signal that is transmitted from the radio broadcast station. For instance, with a vehicle after shipment installed with an audio playback device such as, for instance, an audio CD (Compact Disc) playback unit and an MD (Mini Disc) playback unit, and a DVD (Digital Versatile Disc) playback device, audio information of medium for playback thereof is output as a frequency signal that is available to be received by the radio receiver 18. With such a device, audio information of a medium is transmitted for playback as a frequency signal in a frequency band of a radio broadcast and the receiver 18 demodulates audio information to be output from the speaker 19. However, even under such situation, if the switching frequencies and associated harmonics overlap the frequency utilized by the playback device, the speaker 19 outputs audible noise. Therefore, the application of the present invention is effective for such a frequency signal. Incidentally, even under such a situation, the basic pattern of the train of drive pulses is determined so as to have the leading edges and trailing edges to cause a plurality of switching frequencies and a plurality of associated harmonics from matching a bandwidth for one broadcast station of a radio approximate to the frequency utilized by the playback device set forth above. Therefore, even when the noise suppression needs to be taken only for the frequency signal transmitted from the playback device, the noise suppression may be taken for the whole area of the frequency band (such as, for instance, a whole area of the frequency band of the AM broadcast) of the radio utilized by the playback device in the same manner as those of the various embodiments described above.

Under circumstances where the switching frequencies and associated harmonics are liable to discontinuously overlap a given frequency for which the switching device needs to take a measure for noise suppression, the inverse number of the repetition cycle time or the basic time period for the train of drive pulses is set to a value that does not lie in the audible frequency band. The present invention is not limited to such a scheme of setting the spread frequency to a range higher than the audible frequency. For instance, even in cases where the train of drive pulses has the basic pattern with the leading edges shifted by appropriate shift amounts to cause the switching frequencies to appear in a pattern typically exemplified in FIG. 17, the basic pattern may be determined in a pattern in which an inverse number of a time period, at which the switching frequencies and associated harmonics do not overlap the given frequency set forth above, is set to a value that does not fall in the audible frequency band.

FIG. 17 exemplarily shows a case in which the measure is taken to achieve noise suppression for the broadcast frequency band ranging from "30 to 300 kHz" in the long wave (W) band. In FIG. 17, the switching frequencies, arising from the basic pattern of to train of drive pulses, include four frequencies of "50 kHz", "147 kHz", "60 kHz" and "53 kHz". Therefore, the spread frequency lies in a value of approximately "13 kHz" that is involved in the audible frequency band. However, suppose that the given frequency mentioned above lies at a value of "300 kHz", the switching frequencies, in which the harmonics overlap such a given frequency, include frequencies of "50 kHz" and "60 kHz". Thus, the inverse number of the period in which these harmonics overlap the given frequency takes a value of "24 kHz" that exceeds the audible frequency. Of course, with such an example, if a frequency beyond "300 kHz" is received, noises resulting from the switching frequencies and associated harmonics arm output in an audible range.

Also, in FIG. 17, a sixth-order harmonic of the switching frequency of "50 kHz" and the fifth-order harmonic of the switching frequency of "60 kHz" overlap and this an example wherein the numbers of orders of the harmonics in overlapping are proximate to each other. On the contrary, it is conceivable that the fifth-order harmonic and a twentieth-order harmonic overlap each other under a case where the numbers of orders of the harmonics are separate from each other in a greater extent during the overlapping state and the inverse number of the period between timings in which the harmonics overlap the given frequency exceeds to audible frequency. However, in such a case, due to the occurrence in which an energy level of the twentieth-order harmonic overlapped with the given frequency is extremely small, the period between the timings in which a given frequency substantially overlaps the fifth-order harmonic determines whether or not audible noise is output from the speaker. Therefore, in such a case, the spread frequency is selected to be higher than the audible frequency.

Incidentally, in FIG. 17, in cases where the switching frequencies arising from the basic patter of the train of drive pulses take the frequencies of "50 kHz", "60 kHz", "47 kHz" and "53 kHz" in this sequence, the inverse number of the period in which these harmonics are caused to overlap the given frequency lies in a value of approximately "13 kHz" that lies in the audible frequency range.

Further, by selecting the spread frequency of the repetition cycle of the train of drive pulses to be less than the audible frequency (of, for instance, "20 Hz"), the inverse number of the repetition cycle time does not fall in the audible frequency band under situations where the switching frequencies and associated harmonics intermittently overlap a given frequency for which the switching device needs to take a measure for noise suppression. However, in this case, under circumstances harmonics where as shown in FIG. 17, plural numbers of the switching frequencies and associated harmonics overlap the given frequency mentioned above, a probability occurs for the inverse number of the period between the timings in which the overlapping takes place falls in an audible frequency band. Therefore, if the number, in which the plural numbers of the switching frequencies and associated harmonics overlap the given frequency, is regarded to be a duplication number, then, the spread frequency may be preferably set to be less than a value of "Audible Frequency (of, for instance, "20 Hz")/(Duplication Number)".

While the first embodiment has been described above with reference to the method in which the train of the drive pulses has the basic pattern arranged to provide the average duty in conformity with the demanded duty. However, the present invention is not limited to such a method.

Figure 18:
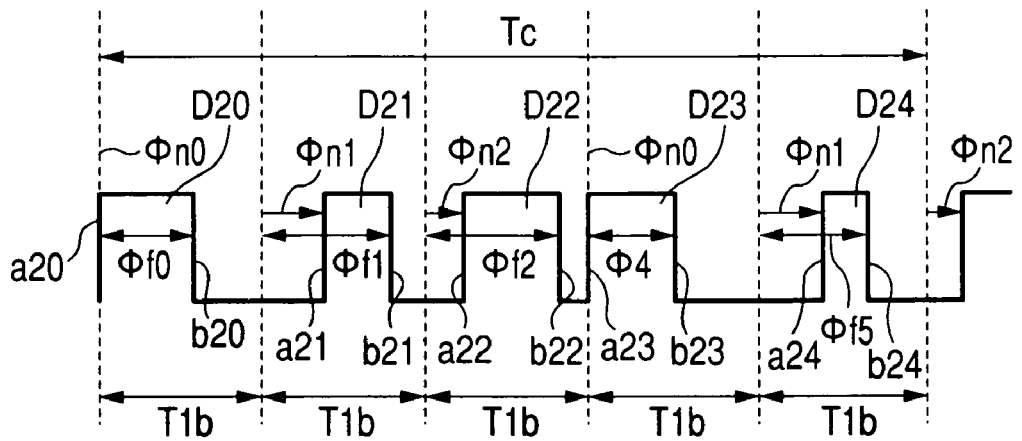
FIG. 18 is a waveform diagram of a train of drive pulses of a modified form of the second embodiment.

For instance, a train of drive pulses to be generated by the drive signal generator 31 of the switching device 30 (see FIG. 2) may be modified in a manner as shown by a train of drive pulses D20 to D24 as shown in FIG. 18. In FIG. 18, the train of drive pulses D20 to D24 has a basic pattern BP4 for a repetition cycle time Tc, longer than the normal repetition cycle time of the basic pattern mentioned above, which has basic time periods T1$b$. Under such a basic pattern BP4, the drive pulses D20 to D22 have leading edges a20 to a22 shifted from the respective basic time periods T1$b$ by shift amounts Φn0 to Φn2 and tailing edges b20 to b22 shifted from the respective basic time periods T1$b$ by amounts Φf0 to Φf2. Also, the drive pulses D23 and D24 have leading edges a23 and a24 shifted from the respective basic time periods T1$b$ by the same shift amounts Φn0 and Φn1 as those of the drive pulses D20 and D21 and trailing edges b23 and b24 shifted from the respective basic time periods T1$b$ by shift amounts Φf4 and Φf5. With such a wave form of the train of drive pulses under the basic pattern BP4, the drive pulses provides an average duty, representing a ratio of the on-time or off-time to the repetition cycle time, in conformity with a demanded duty. The duty "DT" provided by the train of drive pulses D20 to D24 is expressed by an equation expressed below.

$$DT=(-\Phi n0+\Phi f0-\Phi n1+\Phi f1-\Phi n2+\Phi f2-\Phi f0+\Phi f4-\Phi n1+\Phi f5)/Tc$$

In this ease, if switching frequencies, arcing from the basic pattern BP4, do not overlap each other, then, a spread frequency, which is an inverse number of the repetition cycle time Tc of the basic pattern BP4, may be set to be higher than the audible frequency band, making it possible to obtain the advantageous effect (1) of the first embodiment.

Figure 19:
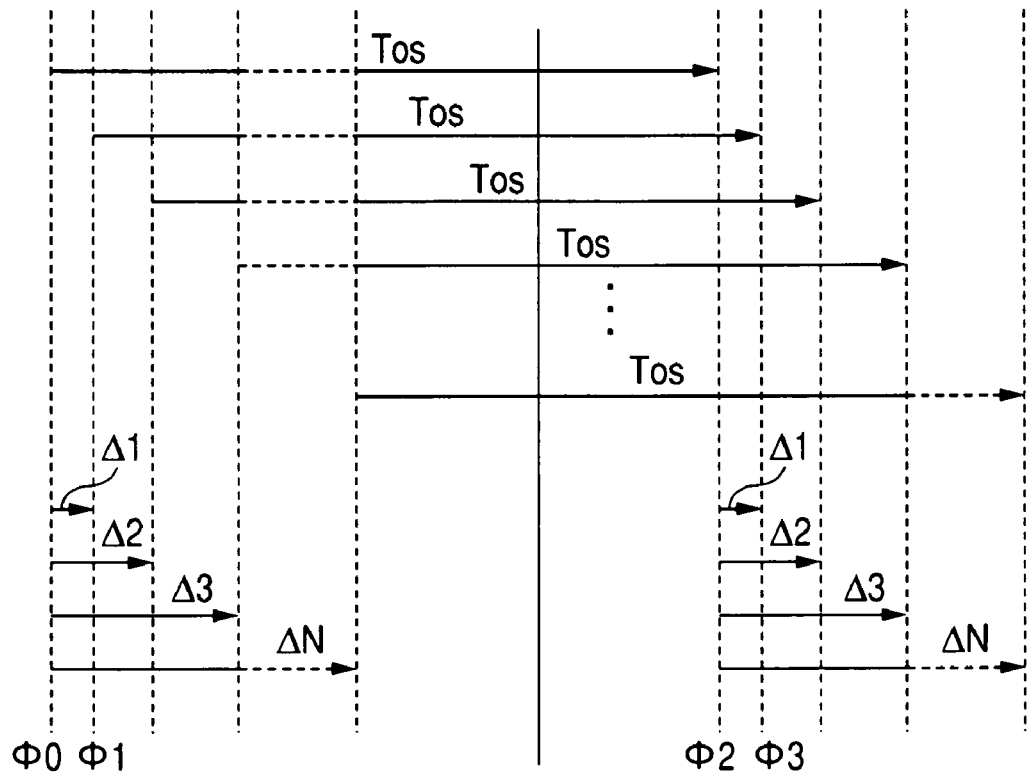
FIG. 19 is a view showing a basic pattern to be used for generating a train of drive pulses of a modified form of the third and fourth embodiments.

With the third embodiment mentioned above, the basic pattern may be determined in the manner indicated in the second embodiment using the basic shift amounts Δ1 to ΔN and the offset value Tos. In such alteration, if the offset value is employed for every two basic patterns as shown in FIG. 19, a frequency difference between the switching frequencies, resulting from the basic pattern, can be set to a value higher than a bandwidth of an AM broadcast even when the basic shift amounts Δ1 to ΔN are set to very small values.

That is, by taking the offset value in a large value, a frequency difference between adjacent switching frequencies given by F01=1/(T1−Φ0+Φ1)=1/(T1−Δ1+Δ2) and F12=1/(T1−Φ1+Φ2)=1/(T1+Tos) can be set to a value higher than the bandwidth.

Although the present invention has been described with reference to the embodiments wherein the switching frequencies have the desired control variables obtained by duty control performed in the modes set forth above, the present invention is not limited to such duty control. That is, in performing the above control, the switching frequencies may be determined such that the switching frequencies and associated harmonics overlap a given frequency, for which the switching device needs to take a measure for noise suppression, merely in a discontinuous manner even in the occurrence of the switching frequencies and associated harmonics overlapping the given frequency. Additionally, the switching frequencies may be set in a way to prevent the inverse number of the repetition cycle time or the basic time period from falling in an audible frequency band, enabling noise to be output from the speaker in an inaudible frequency range.

While the present invention has been described with reference to the switching device wherein if the switching frequencies and associated harmonics discontinuously overlap the given frequency for which the switching device needs to take a measure for noise suppression, the basic pattern is used to turn the switching power transistor on and off with the switching frequencies and associated harmonics determined in the mode to preclude the inverse number of the repetition cycle dine or the basic time period from falling in the audible frequency band. The present invention is not limited to such a switching device arranged to perform turn-on and turn-off operations depending on the basic pattern set forth above. For instance some of preliminarily determined shift amounts may be correlated to given numbers, after which if the given number matches a number generated by the random number generator, then, the given number is used to select the shift amounts for the switching frequencies to turn the switching power transistor 26 on and off. Even under such a case, the switching device may be configured in a structure to perform various steps including: (a) a step in which the random number generator is caused to operate to generate a random number upon which when specified shift amounts are newly selected, judgment is made to find whether or not the switching frequencies and associated harmonics, associated with the specified shift amounts, overlap a given frequency for which the switching device needs to undertake a measure to suppress noise; (b) a step in which when judgment is made that an overlapping status takes place, the inverse number of the period between one overlapping state and the subsequent overlapping state is calculated; and (c) a step in which when the inverse number resulting from the above calculation falls in an audible frequency band, no operation of the switching power transistor 26 is executed depending on the selected switching frequencies and the random number generator is caused to generate another random number again. Such steps make it possible to obtain advantageous effect based on the advantageous effect (1) of the first embodiment set forth above.

While the switching device has been described above with reference to a structure wherein the DC-DC converter 20, shown in FIG. 12, is employed to perform switching control for repeatedly turning the switching power transistor 26 on and off. The present invention is not limited to such a DC-DC converter 20. For instance, the switching device may employ an insulation bye DC-DC converter 60 shown in FIG. 20.

Figure 20:
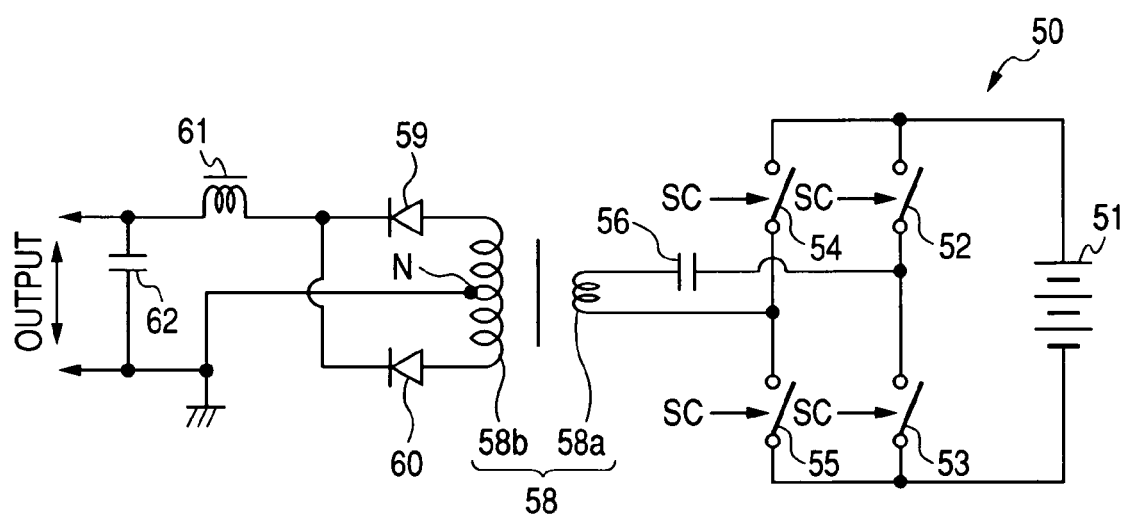
FIG. 20 is a circuit diagram of another exemplary structure of a DC-DC converter to which the switching device of the present invention is applied.

In FIG. 20, the insulation type DC-DC converter 60 is shown including a first series connection, composed of switching power transistors 52, 53, and a second series connection, composed of switching power transistors 54, 55, which are connected to a high-voltage battery 51 in parallel to each other. A capacitor 56 and a coil 58a of a transformer 58 are connected between a junction point between the switching power transistors 52, 53 and a junction point between the switching power transistors 54, 55. On the other hand, diodes 59, 60 are connected to both ends of a coil 58b of the transformer 58, respectively. The diodes 59, 60 have cathodes that are connected to one end of a coil 61, whose other end is connected to one end of a capacitor 62. A node N of the transformer 58 is connected to the ground with the other end of the capacitor 62. Incidentally, a voltage across the both terminals of the capacitor 62 is extracted as an output of the DC-DC converter 60.

Figure 21A:
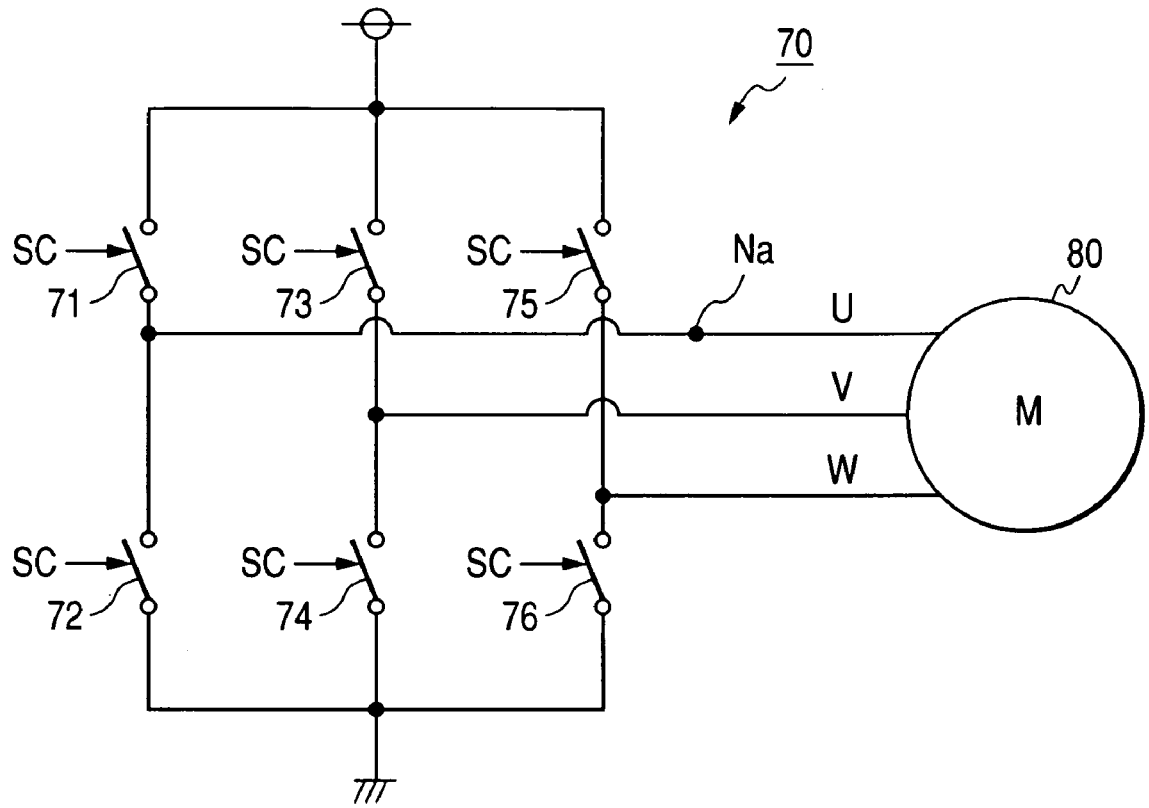
FIG. 21A is a circuit dial of an exemplary structure of an inverter to which the switching device of the present invention is applied.
Figure 21B:
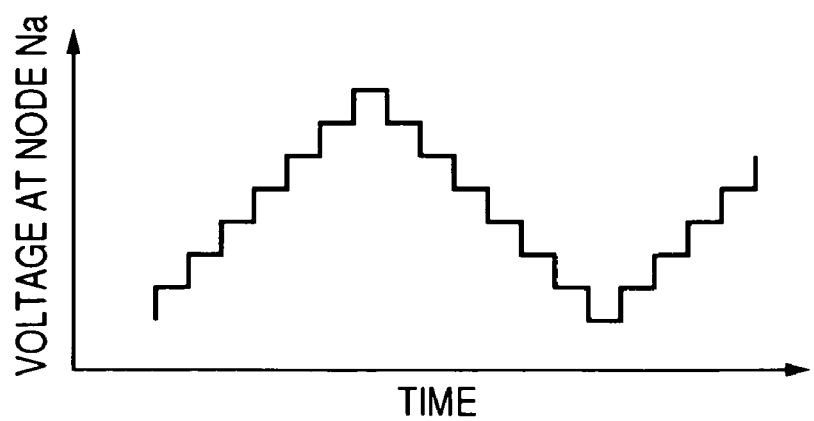
FIG. 21B is a waveform diagram of a voltage in one phase of a three-phase output voltage generated by the inverter shown in FIG. 21A.

Further, the present invention is not limited to the DC-DC converter and may employ an inverter exemplarily shown in FIG. 21A. FIG. 21A shows an exemplary structure in which the inverter 70 is connected to a power steering motor 80. The inverter 70 is comprised of a first series connection, composed of switching power transistors 71, 72, a second series connection, composed of switching power transistors 73, 74 and a third series connection, composed of switching power transistors 75, 76, all of which are connected between a power supply voltage and the ground. Among the first to third series connections, an output is extracted from a junction point between the two switching power transistors (such as, for instance, a junction point between the switching power transistors 71, 72). Incidentally, upon executing switching control, a voltage at a node Na varies in a waveform as shown in FIG. 21B.

While the switching frequencies are determined under the basic pattern, such switching frequencies may cover not only a frequency band of an AM broadcast and a long wave but also a frequency band of an FM broadcast.

In addition, the switching device is not limited to those installed on a vehicle such as a hybrid vehicle or the like. However, in a case where the switching device is installed on the vehicle, the application of the present invention is particularly effective because a playback device such as a car audio device has a fear of suffering noise resulting from switching control.

While the specific embodiments of the present invention have been described in detail it will be appreciated by those skilled in the art that various modifications and alternatives to those details could be developed in light of the overall teachings of the disclosure. Accordingly, the particular arrangements disclosed are meant to be illustrative only and not limited to the scope of the present invention, which is to be given the full breadth of the following clams and all equivalents thereof.

What is claimed is:

1. A switching device for repeatedly turning a switching power element on and off, comprising:

a memory storing a basic pattern; and a drive pulse generator configured to generate a train of drive pulses under the basic pattern, stored in the memory, for a repetition cycle time having a plurality of basic time periods, wherein the number of drive pulses in the train of drive pulses correspond to the number of the basic time periods;

wherein the drive pulses have leading edges, each of the leading edges is shifted from beginnings of the basic time periods by different shift amounts, respectively, and the basic pattern includes an inverse number of the repetition cycle time laying in a value away from an audible frequency band when switching frequencies and associated harmonics, arising from the leading edges and/or the trailing edges of the drive pulses, discontinuously overlap a given frequency for which noise suppression needs to be taken.

2. The switching device according to claim 1, wherein:

the given frequency includes a frequency of a frequency band of a radio broadcast and "to overlap the given frequency" refers to a status wherein a frequency difference with respect to the given frequency lies in a bandwidth for one broadcast station of the radio broadcast.

3. The switching device according to claim 1, wherein:

the drive pulse generator repeatedly generates the train of drive pulses for the repetition cycle time under the basic pattern in which each of the leading edges of the drive pulses are shifted from the basic time periods by the shift amounts, respectively, which are different from each other; and the basic pattern includes a diffusion frequency, representing the inverse number of the repetition cycle time for the basic pattern, which is set to be higher than the audible frequency.

4. The switching device according to claim 3, wherein:
the basic pattern is determined by the drive pulse generator such that all the shift amounts for the leading edges of the drive pulses are different from each other.

5. The switching device according to claim 4, wherein:
the basic pattern includes the shift amounts that are determined to have values to preclude harmonics, arising from the leading edges and/or the trailing edges of the drive pulses, overlapping each other in a frequency band for which the noise suppression needs to be taken.

6. The switching device according to claim 3, wherein:
the memory stores information, including the shift amounts and a sequence of the shift amounts, and offset values; and
the basic pattern includes the shift amounts for the basic time periods and the offset values added to the shift amounts, respectively, which are arranged for the drive pulses.

7. The switching device according to claim 3, wherein:
under a condition where the switching frequencies, arising from the leading edges, and switching frequencies, arising from the trailing edges, do not overlap each other, the drive pulse generator performs variable duty control in a mode to vary the trailing edges with respect to the basic time periods depending on a demanded duty.

8. The switching device according to claim 7, wherein:
the drive pulse generator performs the variable duty control under a condition where the train of drive pulses has an average duty in conformity with a demanded duty.

9. The switching device according to claim 7, wherein:
the drive pulse generator performs the variable duty control under a condition where a plurality of harmonics of the switching frequencies, arising from the leading edges and/or the trailing edges of the drive pulses, do not overlap each other in a frequency band for which the noise suppression needs to be taken.

10. The switching device according to claim 9, wherein:
the frequency band for which the noise suppression needs to be taken includes a frequency band of a radio broadcast and an expression of "the harmonics overlap each other" refers to a status wherein a frequency difference between the harmonics lies in a bandwidth for one broadcast station of the radio broadcast.

11. The switching device according to claim 3, wherein:
a difference between an arbitrary one of the shift amounts and another one of the shift amounts is set to a value greater than "Tr×¼" where "Tr" represents a cycle period of a ringing caused by a surge arising from at least one of turn-on and turn-off operations of the switching power element.

12. A method of operating a switching power element, comprising:
preparing the switching power element; and
applying the switching power element with a train of drive pulses under a basic pattern for a repetition cycle time having a plurality of basic time periods, wherein the number of the drive pulses in the train of drive pulses corresponds to the number of the basic time periods;
wherein the drive pulses leading edges and trailing edges, each of the leading edges is shifted from beginnings of the basic time periods by different shift amounts, respectively, and the basic pattern includes an inverse number of the repetition cycle time laying in a value away from an audible frequency band when switching frequencies and associated harmonics, arising from the leading edges and/or the trailing edges of the drive pulses, discontinuously overlap a given frequency for which noise suppression needs to be taken.

13. The method of operating a switching power element according to claim 12, wherein:
at least one of the leading edges and the trailing edges of the drive pulses are shifted from the basic time periods by the shift amounts, respectively, which are different from each other; and
a diffusion frequency, representing the inverse number of the repetition cycle time for the basic pattern, which is set to be higher than the audible frequency.

14. The method of operating a switching power element according to claim 13, wherein:
the basic pattern includes the shift amounts that are determined to have values to preclude harmonics, arising from the leading edges and/or the trailing edges of the drive pulses, from overlapping each other in a frequency band for which the noise suppression needs to be taken.

15. The method of operating a switching power element according to claim 14, wherein:
the duty cycles are variably controlled under a condition where the train of drive pulses has an average duty in conformity with a demanded duty.

16. The method of operating a switching power element according to claim 14, wherein:
the duty cycles are variably controlled under a condition where a plurality of harmonics of the switching frequencies, arising from the leading edges and/or the trailing edges of the drive pulses, do not overlap each other in a frequency band for which the noise suppression needs to be taken.

17. The method of operating a switching power element according to claim 13, wherein:
under a condition where the switching frequencies, arising from the leading edges, and switching frequencies, arising from the trailing edges, do not overlap each other, variable duty control is performed in a mode to vary the trailing edges with respect to the basic time periods depending on a demanded duty.

18. The method of operating a switching power element according to claim 12, wherein:
all the shift amounts for at least one of the leading edges and the trailing edges of the drive pulses are different from each other.

19. The method of operating a switching power element according to claim 12, wherein:
the basic pattern includes information, including the shift amounts and a sequence of the shift amounts, and offset values, and the shift amounts for the basic time periods and the offset values added to the shift amounts, respectively, which are arranged for the drive pulses.

\* \* \* \* \*

UNITED STATES PATENT AND TRADEMARK OFFICE
CERTIFICATE OF CORRECTION

PATENT NO.         : 7,738,269 B2
APPLICATION NO.    : 11/395341
DATED              : June 15, 2010
INVENTOR(S)        : Shinya Goto et al.

It is certified that error appears in the above-identified patent and that said Letters Patent is hereby corrected as shown below:

On the title page;

Item (73), please change "Denso Corporation, Tokyo (JP)" to "Denso Corporation, Kariya-city (JP)."

Signed and Sealed this
Twenty-sixth Day of July, 2011

David J. Kappos
*Director of the United States Patent and Trademark Office*